United States Patent
Camacho et al.

(10) Patent No.: US 8,643,166 B2
(45) Date of Patent: Feb. 4, 2014

(54) INTEGRATED CIRCUIT PACKAGING SYSTEM WITH LEADS AND METHOD OF MANUFACTURING THEREOF

(75) Inventors: Zigmund Ramirez Camacho, Singapore (SG); Henry Descalzo Bathan, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 59 days.

(21) Appl. No.: 13/327,529

(22) Filed: Dec. 15, 2011

(65) Prior Publication Data

US 2013/0154115 A1 Jun. 20, 2013

(51) Int. Cl.
*H01L 23/48* (2006.01)
*H01L 21/00* (2006.01)

(52) U.S. Cl.
USPC ............ 257/692; 438/121; 438/123; 438/124

(58) Field of Classification Search
USPC .................. 257/692, 777; 438/121, 123, 124
See application file for complete search history.

(56) References Cited

U.S. PATENT DOCUMENTS

| | | | |
|---|---|---|---|
| 6,075,284 A * | 6/2000 | Choi et al. | 257/676 |
| 6,337,510 B1 * | 1/2002 | Chun-Jen et al. | 257/666 |
| 6,459,148 B1 | 10/2002 | Chun-Jen et al. | |
| 7,049,684 B2 * | 5/2006 | Minamio et al. | 257/666 |
| 7,495,319 B2 | 2/2009 | Fukuda et al. | |
| 7,691,674 B1 * | 4/2010 | Bathan et al. | 438/109 |
| 7,709,935 B2 | 5/2010 | Islam et al. | |
| 8,018,036 B2 | 9/2011 | Goh et al. | |
| 2003/0038347 A1 * | 2/2003 | Chiu et al. | 257/678 |
| 2006/0006510 A1 * | 1/2006 | Koduri | 257/678 |
| 2008/0203549 A1 * | 8/2008 | Chow et al. | 257/673 |
| 2011/0201159 A1 * | 8/2011 | Mori et al. | 438/123 |

OTHER PUBLICATIONS

U.S. Appl. No. 13/241,141, filed Sep. 22, 2011, Camacho et al.

* cited by examiner

*Primary Examiner* — Fernando L Toledo
*Assistant Examiner* — Karen Kusumakar
(74) *Attorney, Agent, or Firm* — Ishimaru & Associates LLP

(57) ABSTRACT

A method of manufacture of an integrated circuit packaging system includes: forming a lead having a lead bottom body, a lead top body, and a lead top conductive layer directly on the lead top body, the lead top conductive layer having a top protrusion and a top non-vertical portion, the lead bottom body having a horizontally contiguous structure; connecting an integrated circuit to the top protrusion; and forming an encapsulation covering the integrated circuit and exposing a top non-vertical upper side of the top non-vertical portion.

20 Claims, 6 Drawing Sheets

INTEGRATED CIRCUIT PACKAGING SYSTEM WITH LEADS AND METHOD OF MANUFACTURING THEREOF

TECHNICAL FIELD

The present invention relates generally to an integrated circuit packaging system, and more particularly to a system for an integrated circuit packaging system with leads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead having a lead bottom body, a lead top body, and a lead top conductive layer directly on the lead top body, the lead top conductive layer having a top protrusion and a top non-vertical portion, the lead bottom body having a horizontally contiguous structure; connecting an integrated circuit to the top protrusion; and forming an encapsulation covering the integrated circuit and exposing a top non-vertical upper side of the top non-vertical portion.

The present invention provides an integrated circuit packaging system, including: a lead having a lead bottom body, a lead top body, and a lead top conductive layer directly on the lead top body, the lead top conductive layer having a top protrusion and a top non-vertical portion, the lead bottom body having a horizontally contiguous structure; an integrated circuit connected to the top protrusion; and an encapsulation covering the integrated circuit and exposing a top non-vertical upper side of the top non-vertical portion.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
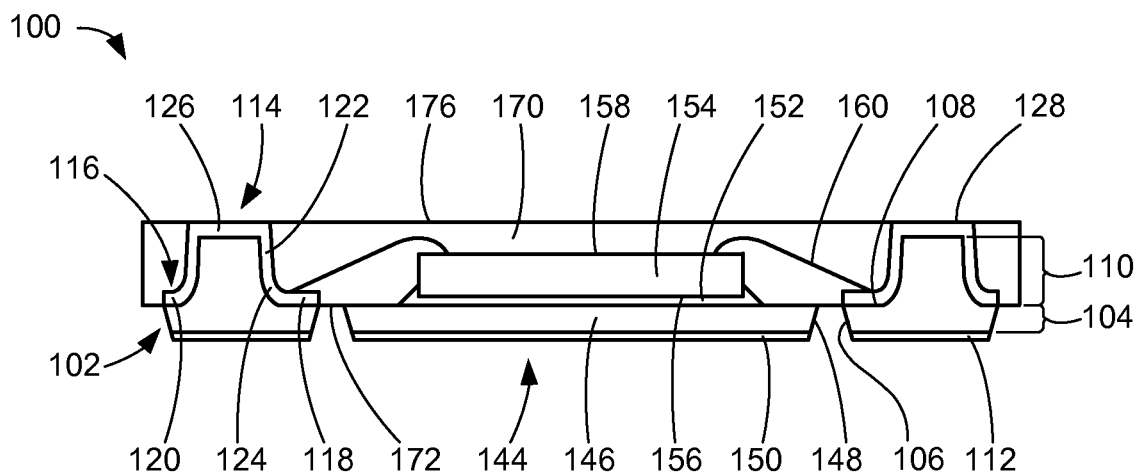
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
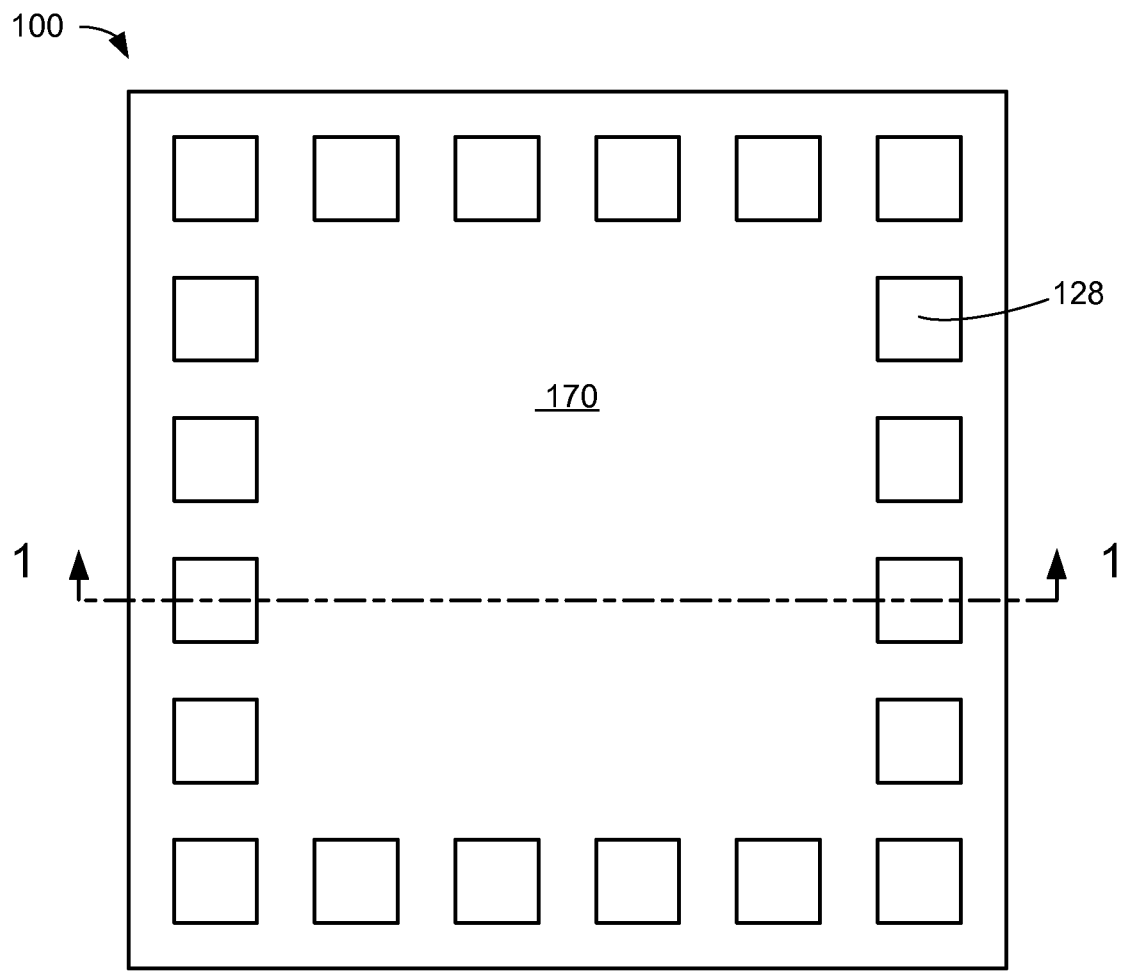
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a stackable strip etched package or a stackable single row strip-etched package.

The integrated circuit packaging system 100 can include a saw singulated multi-row quad flat no-lead (QFNs-mr) or a tapeless quad flat no-lead (QFN). The integrated circuit packaging system 100 can include a strip etched leadframe package for use as an internal stacking module or a Package on Package (PoP).

The integrated circuit packaging system 100 can include leads 102, which are defined as conductive structures that provide connectivity for electrical signals or electrical potential levels between the integrated circuit packaging system 100 and an external system (not shown). For example, the leads 102 can represent terminals.

Each of the leads 102 can include a lead bottom body 104 having a bottom non-horizontal side 106 and a bottom body top side 108. The bottom non-horizontal side 106 is defined as a lateral side of the lead bottom body 104.

The lead bottom body 104 includes a horizontally contiguous structure. The term "horizontally contiguous" means that the lead bottom body 104 is formed without a recess or any openings horizontally from the bottom non-horizontal side 106 to another of the bottom non-horizontal side 106 facing away from the bottom non-horizontal side 106. In other words, the lead bottom body 104 includes a bottom extent without any openings or discontinuities.

For illustration purposes, the bottom non-horizontal side 106 is shown as a planar surface, although it is understood that the bottom non-horizontal side 106 can include any other surfaces. For example, the bottom non-horizontal side 106 can include a curve surface including a concave surface.

Each of the leads 102 can include a lead top body 110 over the lead bottom body 104. The lead bottom body 104 and the lead top body 110 are formed with a single integral structure that is made from the same material in a contiguous shape. The lead top body 110 can include a horizontal width less than a horizontal width of the lead bottom body 104.

Horizontal widths of the lead bottom body 104 and the lead top body 110 are defined as horizontal lengths between non-horizontal extents of the lead bottom body 104 and the lead top body 110, respectively. For example, a horizontal width of the lead top body 110 can be approximately equal to half of a horizontal width of the lead bottom body 104.

Each of the leads 102 can include a lead bottom conductive layer 112, which is defined as an attachment site providing electrical connection to the lead bottom body 104. The lead bottom conductive layer 112 can be formed directly on a bottom extent of the lead bottom body 104.

Each of the leads 102 can include a lead top conductive layer 114, which is defined as an attachment site providing electrical connection to the lead top body 110. The lead top conductive layer 114 can include a top protrusion 116 having a protrusion interior portion 118 and a protrusion exterior portion 120.

The lead top conductive layer 114 can include a top non-horizontal portion 122 and a top connection portion 124 connected to the top protrusion 116 and the top non-horizontal portion 122. The top connection portion 124 can include a curve surface including a concave surface. The top protrusion 116 horizontally extends from the top connection portion 124. The top protrusion 116 can completely horizontally surround the top non-horizontal portion 122.

The lead top conductive layer 114 can include a top non-vertical portion 126 having a top non-vertical upper side 128. The top non-horizontal portion 122 downwardly extends from the top non-vertical portion 126. The top non-horizontal portion 122 is connected to the top connection portion 124 and the top non-vertical portion 126. The top non-vertical upper side 128 is defined as a top extent of the top non-vertical portion 126.

The protrusion interior portion 118, the protrusion exterior portion 120, the top non-horizontal portion 122, the top connection portion 124, and the top non-vertical portion 126 can be formed with a single integral structure that is made from the same material in a contiguous shape. The protrusion interior portion 118 and the protrusion exterior portion 120 can be formed directly on a portion of a peripheral region of the bottom body top side 108.

The top non-horizontal portion 122 can be formed directly on a non-horizontal side of the lead top body 110. The top connection portion 124 can be formed directly on a portion of the bottom body top side 108 and a portion of a non-horizontal side of the lead top body 110. The top non-vertical portion 126 can be formed directly on a top extent of the lead top body 110.

The integrated circuit packaging system 100 can include a package paddle 144, which is defined as a support structure for mounting or attaching a semiconductor device thereon. The package paddle 144 can be adjacent the leads 102. The package paddle 144 can be completely horizontally surrounded by the leads 102.

The package paddle 144 can include a paddle body 146 having a paddle non-horizontal side 148, which is defined as a lateral side of the package paddle 144. The paddle non-horizontal side 148 extends from a bottom extent of the paddle body 146 and a top extent of the paddle body 146.

For illustration purposes, the paddle non-horizontal side 148 is shown as a planar surface, although it is understood that the paddle non-horizontal side 148 can include any other surfaces. For example, the paddle non-horizontal side 148 can include a curve surface including a concave surface.

The package paddle 144 can include a paddle conductive layer 150, which is defined as an attachment site providing electrical connection to the paddle body 146. The paddle conductive layer 150 can be formed directly on a bottom extent of the paddle body 146.

The integrated circuit packaging system 100 can include an attach layer 152, which is defined as a structure for mounting a semiconductor device to a support structure. The integrated circuit packaging system 100 can include an integrated circuit 154, which is defined as a semiconductor device having a number of integrated transistors interconnected to form active circuits.

The integrated circuit 154 can be mounted over the package paddle 144. The integrated circuit 154 can include an inactive side 156 and an active side 158 opposite the inactive side 156. The inactive side 156 can be attached to the package paddle 144 with the attach layer 152.

The integrated circuit packaging system 100 can include electrical connectors 160, which are defined as electrically conductive connectors. Each of the electrical connectors 160 can be electrically connected or attached to the protrusion interior portion 118 and the active side 158.

The protrusion interior portion 118 faces the integrated circuit 154. The protrusion exterior portion 120 faces away from the integrated circuit 154. The protrusion interior portion 118 can include a horizontal length greater than a horizontal length of the protrusion exterior portion 120 to provide a surface area at a top extent of the protrusion interior portion 118 for one of the electrical connectors 160 to be attached thereto.

The integrated circuit packaging system 100 can include an encapsulation 170, which is defined as a package cover of a semiconductor package to hermetically seal a semiconductor device providing mechanical and environmental protection. The encapsulation 170 can cover the integrated circuit 154. The encapsulation 170 can be formed over or on the lead top conductive layer 114, a top extent of the package paddle 144, the attach layer 152, and the electrical connectors 160.

The encapsulation 170 can include an encapsulation bottom side 172, which is defined as a lower extent of the encapsulation 170. The encapsulation bottom side 172 and bottom extents of the protrusion interior portion 118 and the protrusion exterior portion 120 can be coplanar with each other.

The lead bottom body 104 and the package paddle 144 can protrude from the encapsulation bottom side 172. The bottom non-horizontal side 106, the lead bottom conductive layer 112, the paddle non-horizontal side 148, and the paddle conductive layer 150 can be below the encapsulation bottom side 172.

The encapsulation 170 can include an encapsulation top side 176, which is defined as an upper extent of the encapsulation 170. The encapsulation 170 can expose the top non-vertical upper side 128. The encapsulation top side 176 can be coplanar with the top non-vertical upper side 128.

It has been discovered that the encapsulation 170 exposing the top non-vertical upper side 128 provides improved reliability since the top non-vertical upper side 128 is used for three-dimensional (3D) package integration for stacking known-good units.

It has also been discovered that the lead bottom body 104 also provides improved reliability since the lead bottom body 104 includes a horizontally contiguous structure thereby providing a robust structure.

It has further been discovered that the leads 102 each having the top protrusion 116 with the protrusion interior portion 118 and the protrusion exterior portion 120 provides improved signal integrity since the electrical connectors 160 are able to make reliable connection to the protrusion interior portion 118.

It has yet further been discovered that the lead top conductive layer 114 provides reduced height profile with the lead top conductive layer 114 having the top protrusion 116, the top non-horizontal portion 122, the top connection portion 124, and the top non-vertical portion 126 formed as a single vertical integral structure thereby reducing the overall height for stacking a semiconductor package thereon.

It has yet further been discovered that the protrusion interior portion 118 having a horizontal length greater than a horizontal length of the protrusion exterior portion 120 provides improved yield with more area for reliable attachment of the electrical connectors 160.

It has yet further been discovered that the lead bottom body 104 and the paddle body 146 protruding from the encapsulation bottom side 172 provides improved reliability by eliminating electrical short problems between the leads 102 and the package paddle 144 with the lead bottom conductive layer 112 and the paddle conductive layer 150 below the encapsulation bottom side 172.

It has yet further been discovered that the encapsulation bottom side 172 and bottom extents of the protrusion interior portion 118 and the protrusion exterior portion 120 coplanar with each other provides improved reliability because the top protrusion 116 is covered by the encapsulation 170 thereby eliminating peeling of the top protrusion 116 during board level reliability (BLR) and drop tests.

Referring now to FIG. 2, therein is shown a top view of the integrated circuit packaging system 100. The top view depicts each of the leads 102 of FIG. 1 having the top non-vertical upper side 128 exposed from the encapsulation 170. The leads 102 can be formed in an array adjacent a periphery of the encapsulation 170.

Figure 3:
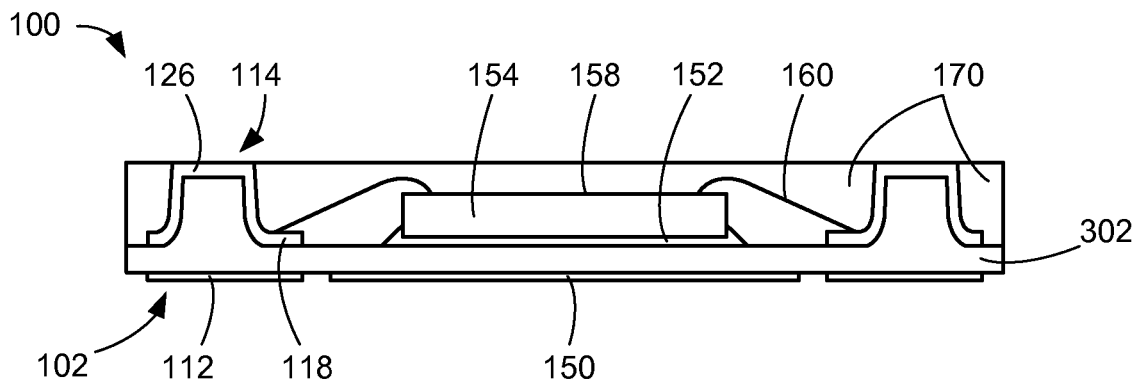
FIG. 3 is a cross-sectional view of the integrated circuit packaging system in a phase of manufacture.

Referring now to FIG. 3, therein is shown a cross-sectional view of the integrated circuit packaging system 100 in a phase of manufacture. The cross-sectional view depicts the integrated circuit packaging system 100 before a removal process including etching, stamping, grinding, masking, or a combination thereof. For example, the removal process can include a half-etched process.

The integrated circuit packaging system 100 can include a carrier 302, which is defined as a conductive material. The carrier 302 can include a conductive material including copper (Cu), any other metals, or metallic alloys. The carrier 302 can be partially removed. The carrier 302 can represent a leadframe.

The integrated circuit packaging system 100 can include a plating process to form the lead bottom conductive layer 112, the lead top conductive layer 114, and the paddle conductive layer 150. The lead bottom conductive layer 112, the lead top conductive layer 114, and the paddle conductive layer 150 can be pre-plated directly on the carrier 302.

The term "pre-plated" means that the lead bottom conductive layer 112, the lead top conductive layer 114, and the paddle conductive layer 150 can be plated or formed during a manufacture phase of the carrier 302. For example, the carrier 302 with the lead bottom conductive layer 112, the lead top conductive layer 114, and the paddle conductive layer 150 pre-plated can represent a pre-plated leadframe (PPF).

For example, the lead top conductive layer 114 can include the top non-vertical portion 126 for bonding surface. Also for example, the lead top conductive layer 114 can be formed as a top lead finish for each of the leads 102.

The lead bottom conductive layer 112, the lead top conductive layer 114, and the paddle conductive layer 150 can be formed with a conductive material including nickel (Ni), palladium (Pd), gold (Au), silver (Ag), copper (Cu), or a combination thereof. For a specific example, the lead bottom conductive layer 112, the lead top conductive layer 114, or the paddle conductive layer 150 can be formed with nickel-palladium-gold (Ni—Pd—Au).

The integrated circuit packaging system 100 can include the integrated circuit 154 mounted over the carrier 302 with the attach layer 152. The integrated circuit packaging system 100 can include the electrical connectors 160 attached to the protrusion interior portion 118 and the active side 158 of the integrated circuit 154.

The integrated circuit packaging system 100 can include the encapsulation 170 formed over portions of the carrier 302, the lead top conductive layer 114, the attach layer 152, the integrated circuit 154, and the electrical connectors 160.

The integrated circuit packaging system 100 can include the removal process in a subsequent phase of manufacture to remove portions at a bottom extent of the carrier 302 that are between the lead bottom conductive layer 112 and the paddle conductive layer 150. After the removal phase, the structure of FIG. 1 can be formed.

Figure 4:
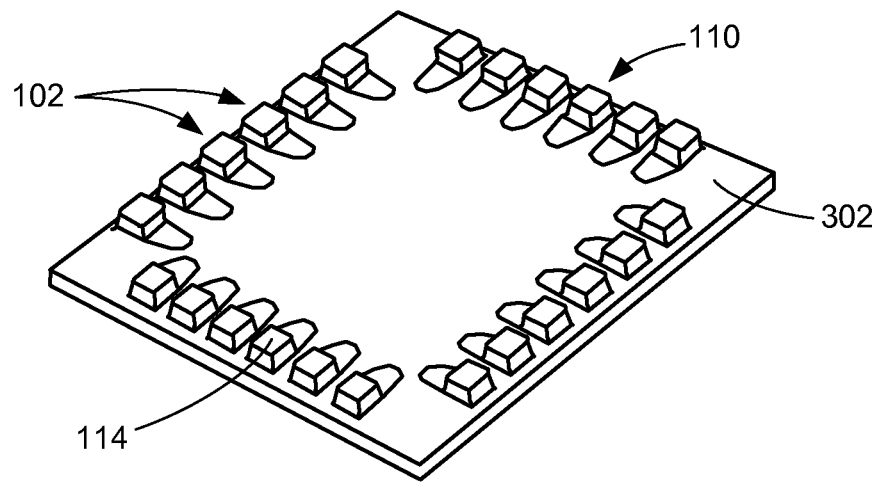
FIG. 4 is an isometric top view of the carrier.

Referring now to FIG. 4, therein is shown an isometric top view of the carrier 302. The isometric top view depicts the carrier 302 having the lead top body 110 of each of the leads 102.

The lead top body 110 can be selectively plated to form the lead top conductive layer 114. The lead top body 110 can be formed in an array adjacent a periphery of the carrier 302. For example, the lead top body 110 can represent a protruding inner lead.

Figure 5:
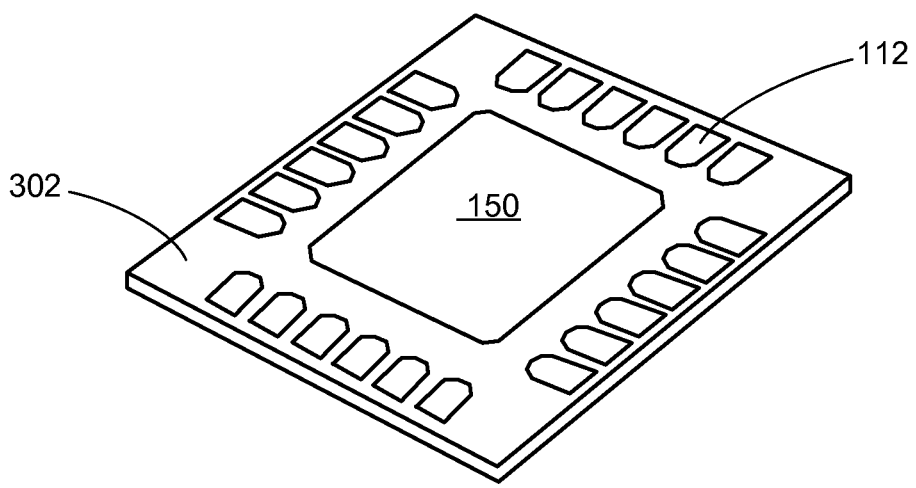
FIG. 5 is an isometric bottom view of the carrier.

Referring now to FIG. 5, therein is shown an isometric bottom view of the carrier 302. The isometric bottom view depicts the carrier 302 having a pattern of the lead bottom conductive layer 112 and the paddle conductive layer 150.

The lead bottom conductive layer 112 can be formed in an array adjacent a periphery of the carrier 302. The array of a plurality of the lead bottom conductive layer 112 can completely horizontally surround the paddle conductive layer 150, which can be at a central region of the carrier 302.

The lead bottom conductive layer 112 and the paddle conductive layer 150 can be selectively plated. For example, the lead bottom conductive layer 112 and the paddle conductive layer 150 can represent a land pad and a die pad.

Figure 6:
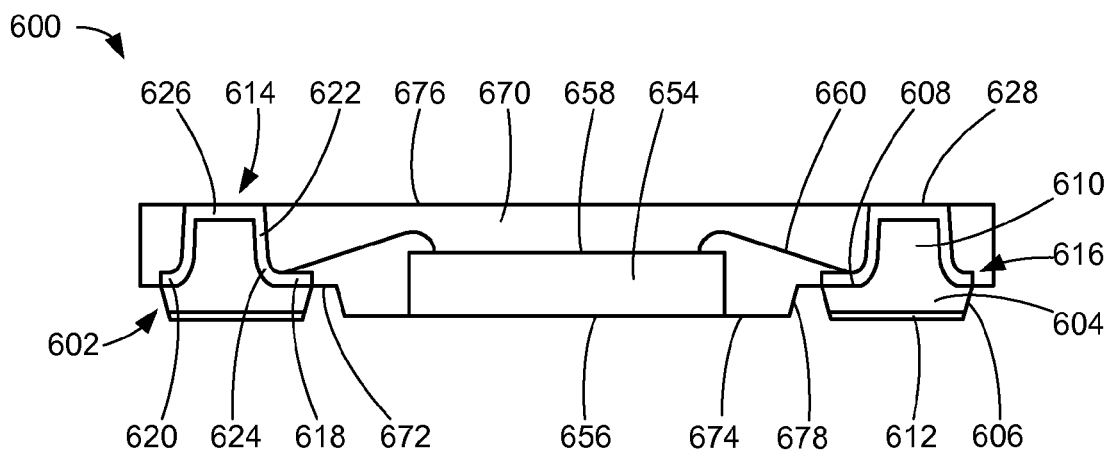
FIG. 6 is a cross-sectional view of an integrated circuit packaging system in a second embodiment of the present invention.

Referring now to FIG. 6, therein is shown a cross-sectional view of an integrated circuit packaging system 600 in a second embodiment of the present invention. The integrated circuit packaging system 600 can include a central die cavity.

The integrated circuit packaging system 600 can include leads 602, which are defined as conductive structures that provide connectivity for electrical signals or electrical potential levels between the integrated circuit packaging system 600 and an external system (not shown). For example, the leads 602 can represent terminals.

Each of the leads 602 can include a lead bottom body 604 having a bottom non-horizontal side 606 and a bottom body top side 608. The bottom non-horizontal side 606 is defined as a lateral side of the lead bottom body 604.

The lead bottom body 604 can include a horizontally contiguous structure. The term "horizontally contiguous" means that the lead bottom body 604 is formed without a recess or any openings horizontally from the bottom non-horizontal side 606 to another of the bottom non-horizontal side 606 facing away from the bottom non-horizontal side 606. In other words, the lead bottom body 604 includes a bottom extent without any openings or discontinuities.

For illustration purposes, the bottom non-horizontal side 606 is shown as a planar surface, although it is understood that the bottom non-horizontal side 606 can include any other surfaces. For example, the bottom non-horizontal side 606 can include a curve surface including a concave surface.

Each of the leads 602 can include a lead top body 610 over the lead bottom body 604. The lead bottom body 604 and the lead top body 610 are formed with a single integral structure that is made from the same material in a contiguous shape. The lead top body 610 can include a horizontal width less than a horizontal width of the lead bottom body 604.

Horizontal widths of the lead bottom body 604 and the lead top body 610 are defined as horizontal lengths between non-horizontal extents of the lead bottom body 604 and the lead top body 610, respectively. For example, a horizontal width of the lead top body 610 can be approximately equal to half of a horizontal width of the lead bottom body 604.

Each of the leads 602 can include a lead bottom conductive layer 612, which is defined as an attachment site providing electrical connection to the lead bottom body 604. The lead bottom conductive layer 612 can be formed directly on a bottom extent of the lead bottom body 604.

Each of the leads 602 can include a lead top conductive layer 614, which is defined as an attachment site providing electrical connection to the lead top body 610. The lead top conductive layer 614 can include a top protrusion 616 having a protrusion interior portion 618 and a protrusion exterior portion 620.

The lead top conductive layer 614 can include a top non-horizontal portion 622 and a top connection portion 624 connected to the top protrusion 616 and the top non-horizontal portion 622. The top connection portion 624 can include a curve surface including a concave surface.

The top protrusion 616 horizontally extends from the top connection portion 624. The top protrusion 616 can completely horizontally surround the top non-horizontal portion 622.

The lead top conductive layer 614 can include a top non-vertical portion 626 having a top non-vertical upper side 628. The top non-horizontal portion 622 downwardly extends from the top non-vertical portion 626. The top non-horizontal portion 622 is connected to the top connection portion 624 and the top non-vertical portion 626. The top non-vertical upper side 628 is defined as a top extent of the top non-vertical portion 626.

The protrusion interior portion 618, the protrusion exterior portion 620, the top non-horizontal portion 622, the top connection portion 624, and the top non-vertical portion 626 can be formed with a single integral structure that is made from the same material in a contiguous shape. The protrusion interior portion 618 and the protrusion exterior portion 620 can be formed directly on a portion of a peripheral region of the bottom body top side 608.

The top non-horizontal portion 622 can be formed directly on a non-horizontal side of the lead top body 610. The top connection portion 624 can be formed directly on a portion of the bottom body top side 608 and a portion of a non-horizontal side of the lead top body 610. The top non-vertical portion 626 can be formed directly on a top extent of the lead top body 610.

The integrated circuit packaging system 600 can include an integrated circuit 654, which is defined as a semiconductor device having a number of integrated transistors interconnected to form active circuits. The integrated circuit 654 can be adjacent the leads 602. The integrated circuit 654 can be completely horizontally surrounded by the leads 602. The integrated circuit 654 can include an inactive side 656 and an active side 658 opposite the inactive side 656.

The integrated circuit packaging system 600 can include electrical connectors 660, which are defined as electrically conductive connectors. Each of the electrical connectors 660 can be electrically connected or attached to the protrusion interior portion 618 and the active side 658.

The protrusion interior portion 618 faces the integrated circuit 654. The protrusion exterior portion 620 faces away from the integrated circuit 654. The protrusion interior portion 618 can include a horizontal length greater than a horizontal length of the protrusion exterior portion 620 to provide a surface area at a top extent of the protrusion interior portion 618 for one of the electrical connectors 660 to be attached thereto.

The integrated circuit packaging system 600 can include an encapsulation 670, which is defined as a package cover of a semiconductor package to hermetically seal a semiconductor device providing mechanical and environmental protection. The encapsulation 670 can cover the integrated circuit 654. The encapsulation 670 can be formed over or on the lead top conductive layer 614 and the electrical connectors 660.

The encapsulation 670 can include a first encapsulation bottom side 672, which is defined as a lower extent of the encapsulation 670. The first encapsulation bottom side 672 and bottom extents of the protrusion interior portion 618 and the protrusion exterior portion 620 can be coplanar with each other.

The lead bottom body 604 can protrude from the first encapsulation bottom side 672. The bottom non-horizontal side 606 and the lead bottom conductive layer 612 can be below the first encapsulation bottom side 672.

The encapsulation 670 can include a second encapsulation bottom side 674, which is defined as another lower extent of the encapsulation 670. The second encapsulation bottom side 674 is below the first encapsulation bottom side 672. The second encapsulation bottom side 674, the inactive side 656, and a bottom extent of the lead bottom body 604 can be coplanar with each other.

The encapsulation 670 can include an encapsulation top side 676, which is defined as an upper extent of the encapsulation 670. The encapsulation 670 can expose the top non-vertical upper side 628. The encapsulation top side 676 can be coplanar with the top non-vertical upper side 628.

The encapsulation 670 can include an encapsulation non-horizontal side 678, which is defined as a lateral extent of the encapsulation 670. The encapsulation non-horizontal side 678 can extend from the first encapsulation bottom side 672 to the second encapsulation bottom side 674.

For illustration purposes, the encapsulation non-horizontal side 678 is shown at an obtuse angle to the second encapsulation bottom side 674 or at a reflex angle to the first encapsulation bottom side 672, although it is understood that the encapsulation non-horizontal side 678 can be at any angles to the second encapsulation bottom side 674 and the first encapsulation bottom side 672. For example, the encapsulation non-horizontal side 678 can be at a right angle to the second encapsulation bottom side 674 and the first encapsulation bottom side 672.

It has been discovered that the encapsulation 670 exposing the top non-vertical upper side 628 provides improved reliability since the top non-vertical upper side 628 is used for three-dimensional (3D) package integration for stacking known-good units.

It has also been discovered that the lead bottom body 604 also provides improved reliability since the lead bottom body 604 includes a horizontally contiguous structure thereby providing a robust structure.

It has further been discovered that the leads 602 each having the top protrusion 616 with the protrusion interior portion 618 and the protrusion exterior portion 620 provides improved signal integrity since the electrical connectors 660 are able to make reliable connection to the protrusion interior portion 618.

It has yet further been discovered that the lead top conductive layer 614 provides reduced height profile with the lead top conductive layer 614 having the top protrusion 616, the top non-horizontal portion 622, the top connection portion 624, and the top non-vertical portion 626 formed as a single vertical integral structure thereby reducing the overall height for stacking a semiconductor package thereon.

It has yet further been discovered that the protrusion interior portion 618 having a horizontal length greater than a horizontal length of the protrusion exterior portion 620 provides improved yield with more area for reliable attachment of the electrical connectors 660.

It has yet further been discovered that the first encapsulation bottom side 672 and bottom extents of the protrusion interior portion 618 and the protrusion exterior portion 620 coplanar with each other provides improved reliability because the top protrusion 616 is covered by the encapsulation 670 thereby eliminating peeling of the top protrusion 616 during board level reliability (BLR) and drop tests.

It has yet further been discovered that the second encapsulation bottom side 674, the inactive side 656, and a bottom extent of the lead bottom body 604 coplanar with each other provides reduced height profile since a vertical height of each of the leads 602 is reduced.

Figure 7:
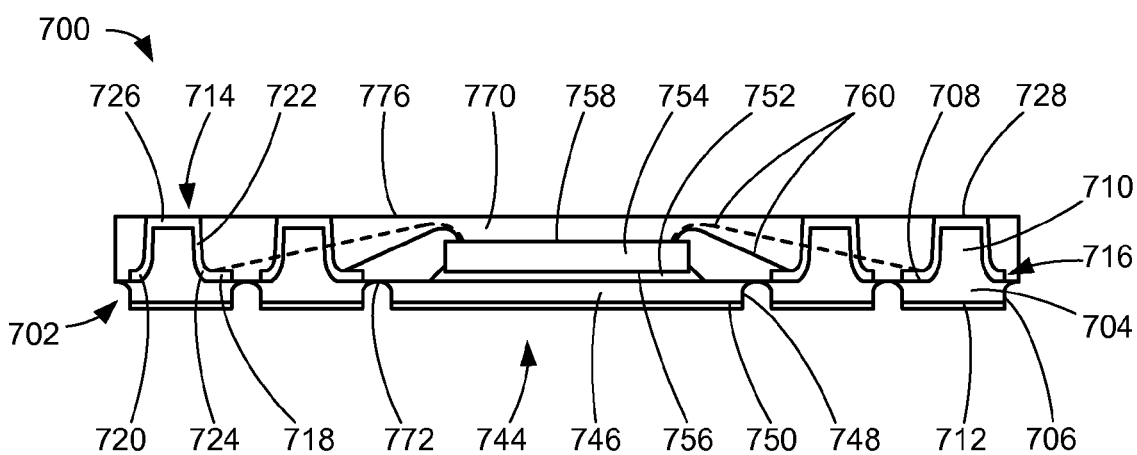
FIG. 7 is a cross-sectional view of an integrated circuit packaging system in a third embodiment of the present invention.

Referring now to FIG. 7, therein is shown a cross-sectional view of an integrated circuit packaging system 700 in a third embodiment of the present invention. The integrated circuit packaging system 700 can include a stackable strip-etched dual-row package.

The integrated circuit packaging system 700 can include leads 702, which are defined as conductive structures that provide connectivity for electrical signals or electrical potential levels between the integrated circuit packaging system 700 and an external system (not shown). For example, the leads 702 can represent terminals.

Each of the leads 702 can include a lead bottom body 704 having a bottom non-horizontal side 706 and a bottom body top side 708. The bottom non-horizontal side 706 is defined as a lateral side of the lead bottom body 704.

The lead bottom body 704 can include a horizontally contiguous structure. The term "horizontally contiguous" means that the lead bottom body 704 is formed without a recess or any openings horizontally from the bottom non-horizontal side 706 to another of the bottom non-horizontal side 706 facing away from the bottom non-horizontal side 706. In other words, the lead bottom body 704 includes a bottom extent without any openings or discontinuities.

Each of the leads 702 can include a lead top body 710 over the lead bottom body 704. The lead bottom body 704 and the lead top body 710 are formed with a single integral structure that is made from the same material in a contiguous shape. The lead top body 710 can include a horizontal width less than a horizontal width of the lead bottom body 704.

Horizontal widths of the lead bottom body 704 and the lead top body 710 are defined as horizontal lengths between non-horizontal extents of the lead bottom body 704 and the lead top body 710, respectively. For example, a horizontal width of the lead top body 710 can be approximately equal to half of a horizontal width of the lead bottom body 704.

Each of the leads 702 can include a lead bottom conductive layer 712, which is defined as an attachment site providing electrical connection to the lead bottom body 704. The lead bottom conductive layer 712 can be formed directly on a bottom extent of the lead bottom body 704.

Each of the leads 702 can include a lead top conductive layer 714, which is defined as an attachment site providing electrical connection to the lead top body 710. The lead top conductive layer 714 can include a top protrusion 716 having a protrusion interior portion 718 and a protrusion exterior portion 720.

The lead top conductive layer 714 can include a top non-horizontal portion 722 and a top connection portion 724 connected to the top protrusion 716 and the top non-horizontal portion 722. The top connection portion 724 can include a curve surface including a concave surface.

The top protrusion 716 horizontally extends from the top connection portion 724. The top protrusion 716 can completely horizontally surround the top non-horizontal portion 722.

The lead top conductive layer 714 can include a top non-vertical portion 726 having a top non-vertical upper side 728. The top non-horizontal portion 722 downwardly extends from the top non-vertical portion 726. The top non-horizontal portion 722 is connected to the top connection portion 724 and the top non-vertical portion 726. The top non-vertical upper side 728 is defined as a top extent of the top non-vertical portion 726.

The protrusion interior portion 718, the protrusion exterior portion 720, the top non-horizontal portion 722, the top connection portion 724, and the top non-vertical portion 726 can be formed with a single integral structure that is made from the same material in a contiguous shape. The protrusion interior portion 718 and the protrusion exterior portion 720 can be formed directly on a portion of a peripheral region of the bottom body top side 708.

The top non-horizontal portion 722 can be formed directly on a non-horizontal side of the lead top body 710. The top connection portion 724 can be formed directly on a portion of the bottom body top side 708 and a portion of a non-horizontal side of the lead top body 710. The top non-vertical portion 726 can be formed directly on a top extent of the lead top body 710.

The integrated circuit packaging system 700 can include a package paddle 744, which is defined as a support structure for mounting or attaching a semiconductor device thereon.

The package paddle 744 can be adjacent the leads 702. The package paddle 744 can be completely horizontally surrounded by the leads 702.

The package paddle 744 can include a paddle body 746 having a paddle non-horizontal side 748, which is defined as a lateral side of the package paddle 744. The paddle non-horizontal side 748 extends from a bottom extent of the paddle body 746 and a top extent of the paddle body 746.

The package paddle 744 can include a paddle conductive layer 750, which is defined as an attachment site providing electrical connection to the paddle body 746. The paddle conductive layer 750 can be formed directly on a bottom extent of the paddle body 746.

The integrated circuit packaging system 700 can include an attach layer 752, which is defined as a structure for mounting a semiconductor device to a support structure. The integrated circuit packaging system 700 can include an integrated circuit 754, which is defined as a semiconductor device having a number of integrated transistors interconnected to form active circuits.

The integrated circuit 754 can be mounted over the package paddle 744. The integrated circuit 754 can include an inactive side 756 and an active side 758 opposite the inactive side 756. The inactive side 756 can be attached to the package paddle 744 with the attach layer 752.

The integrated circuit packaging system 700 can include electrical connectors 760, which are defined as electrically conductive connectors. Each of the electrical connectors 760 can be electrically connected or attached to the protrusion interior portion 718 and the active side 758.

The protrusion interior portion 718 faces the integrated circuit 754. The protrusion exterior portion 720 faces away from the integrated circuit 754. The protrusion interior portion 718 can include a horizontal length greater than a horizontal length of the protrusion exterior portion 720 to provide a surface area at a top extent of the protrusion interior portion 718 for one of the electrical connectors 760 to be attached thereto.

The integrated circuit packaging system 700 can include an encapsulation 770, which is defined as a package cover of a semiconductor package to hermetically seal a semiconductor device providing mechanical and environmental protection. The encapsulation 770 can cover the integrated circuit 754. The encapsulation 770 can be formed over or on the lead top conductive layer 714, a top extent of the package paddle 744, the attach layer 752, and the electrical connectors 760.

The encapsulation 770 can include an encapsulation bottom side 772, which is defined as a lower extent of the encapsulation 770. The encapsulation bottom side 772 and bottom extents of the protrusion interior portion 718 and the protrusion exterior portion 720 can be coplanar with each other.

The lead bottom body 704 and the package paddle 744 can protrude from the encapsulation bottom side 772. The bottom non-horizontal side 706, the lead bottom conductive layer 712, the paddle non-horizontal side 748, and the paddle conductive layer 750 can be below the encapsulation bottom side 772.

The encapsulation 770 can include an encapsulation top side 776, which is defined as an upper extent of the encapsulation 770. The encapsulation 770 can expose the top non-vertical upper side 728. The encapsulation top side 776 can be coplanar with the top non-vertical upper side 728.

The integrated circuit packaging system 700 can include a number of rows of the leads 702. For illustration purposes, the cross-sectional view depicts two rows of the leads 702, although it is understood that the integrated circuit packaging system 700 can include any number of rows of the leads 702.

The integrated circuit packaging system 700 can include a number of the electrical connectors 760. For illustration purposes, the cross-sectional view depicts four of the electrical connectors 760, although it is understood that the integrated circuit packaging system 700 can include any number of rows of the electrical connectors 760. For example, the integrated circuit packaging system 700 can include one of the electrical connectors 760 attached to the active side 758 and one of the leads 702 and another of the electrical connectors 760 (shown with a dash line) attached to the active side 758 and another of the leads 702.

It has been discovered that the encapsulation 770 exposing the top non-vertical upper side 728 provides improved reliability since the top non-vertical upper side 728 is used for three-dimensional (3D) package integration for stacking known-good units.

It has also been discovered that the lead bottom body 704 also provides improved reliability since the lead bottom body 704 includes a horizontally contiguous structure thereby providing a robust structure.

It has further been discovered that the leads 702 each having the top protrusion 716 with the protrusion interior portion 718 and the protrusion exterior portion 720 provides improved signal integrity since the electrical connectors 760 are able to make reliable connection to the protrusion interior portion 718.

It has yet further been discovered that the lead top conductive layer 714 provides reduced height profile with the lead top conductive layer 714 having the top protrusion 716, the top non-horizontal portion 722, the top connection portion 724, and the top non-vertical portion 726 formed as a single vertical integral structure thereby reducing the overall height for stacking a semiconductor package thereon.

It has yet further been discovered that the protrusion interior portion 718 having a horizontal length greater than a horizontal length of the protrusion exterior portion 720 provides improved yield with more area for reliable attachment of the electrical connectors 760.

It has yet further been discovered that the lead bottom body 704 and the paddle body 746 protruding from the encapsulation bottom side 772 provides improved reliability by eliminating electrical short problems between the leads 702 and the package paddle 744 with the lead bottom conductive layer 712 and the paddle conductive layer 750 below the encapsulation bottom side 772.

It has yet further been discovered that the encapsulation bottom side 772 and bottom extents of the protrusion interior portion 718 and the protrusion exterior portion 720 coplanar with each other provides improved reliability because the top protrusion 716 is covered by the encapsulation 770 thereby eliminating peeling of the top protrusion 716 during board level reliability (BLR) and drop tests.

It has yet further been discovered that an array of a number of rows of the leads 702 provides improved reliability by providing additional attachment sites for a stack semiconductor package to mount thereon.

Figure 8:
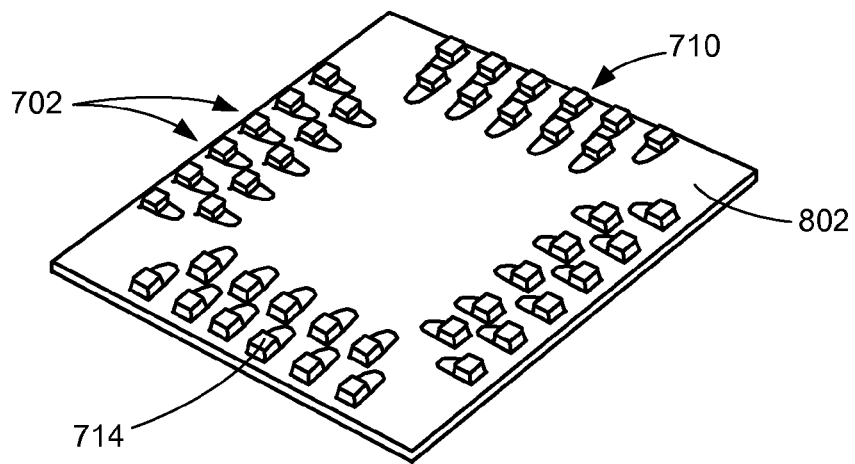
FIG. 8 is an isometric top view of a carrier.

Referring now to FIG. 8, therein is shown an isometric top view of a carrier 802. The isometric top view depicts the carrier 802 having the lead top body 710 of each of the leads 702. A plurality of the lead top body 710 can be formed in any number of rows. The plurality of the lead top body 710 can be formed with one of the plurality of the lead top body 710 in one row staggered or offset from another of the plurality of the lead top body 710 in another row.

The lead top body 710 can be selectively plated to form the lead top conductive layer 714. The lead top body 710 can be formed in an array adjacent a periphery of the carrier 802. For example, the lead top body 710 can represent a protruding inner lead.

Figure 9:
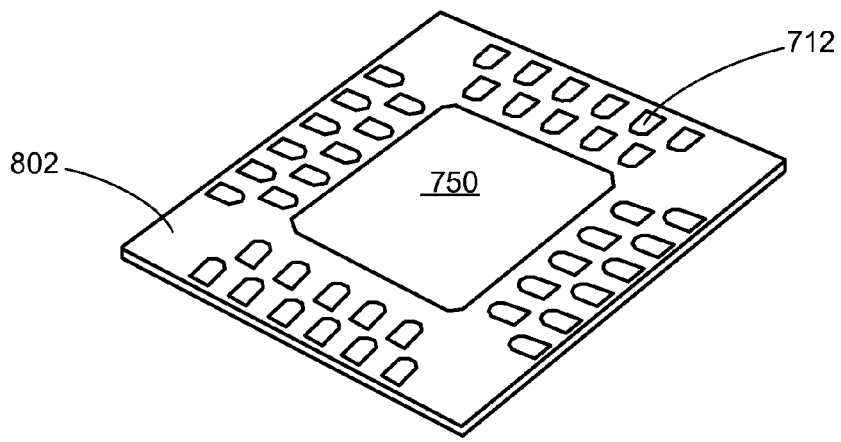
FIG. 9 is an isometric bottom view of the carrier.

Referring now to FIG. 9, therein is shown an isometric bottom view of the carrier 802. The isometric bottom view depicts the carrier 802 having a pattern of a plurality of the lead bottom conductive layer 712 and the paddle conductive layer 750. The plurality of the lead bottom conductive layer 712 can be formed in any number of rows. The plurality of the lead bottom conductive layer 712 can be formed with one of the plurality of the lead bottom conductive layer 712 in one row staggered or offset from another of the plurality of the lead bottom conductive layer 712 in another row.

The lead bottom conductive layer 712 can be formed in an array adjacent a periphery of the carrier 802. The array of a plurality of the lead bottom conductive layer 712 can completely horizontally surround the paddle conductive layer 750, which can be at a central region of the carrier 802.

The lead bottom conductive layer 712 and the paddle conductive layer 750 can be selectively plated. For example, the lead bottom conductive layer 712 and the paddle conductive layer 750 can represent a land pad and a die pad.

Figure 10:
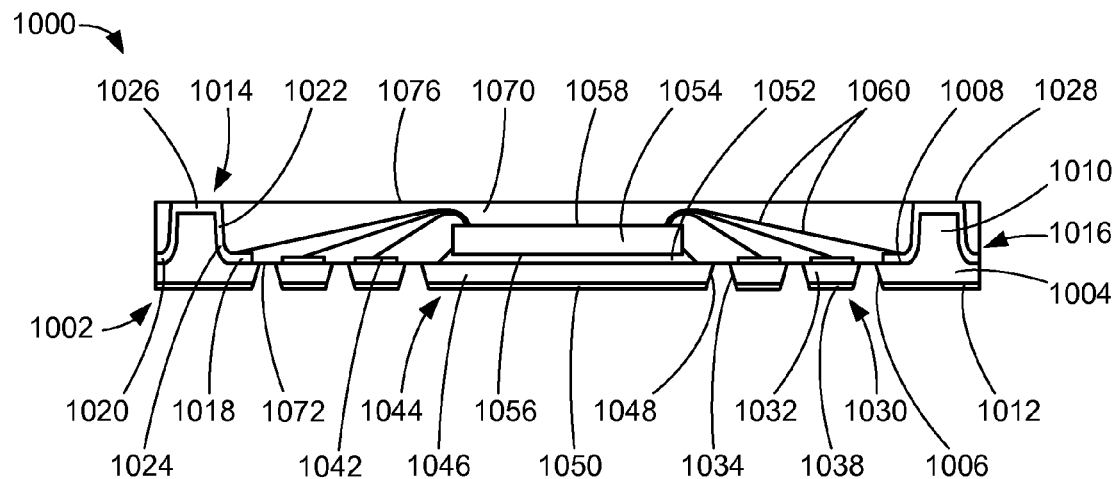
FIG. 10 is a cross-sectional view of an integrated circuit packaging system in a fourth embodiment of the present invention.

Referring now to FIG. 10, therein is shown a cross-sectional view of an integrated circuit packaging system 1000 in a fourth embodiment of the present invention. The integrated circuit packaging system 1000 can include a lead structure with bottom multi-rows and a top single-row.

The integrated circuit packaging system 1000 can include exterior leads 1002, which are defined as conductive structures that provide connectivity for electrical signals or electrical potential levels between the integrated circuit packaging system 1000 and an external system (not shown). For example, the exterior leads 1002 can represent terminals.

Each of the exterior leads 1002 can include an exterior lead bottom body 1004 having an exterior bottom non-horizontal side 1006 and an exterior bottom body top side 1008. The exterior bottom non-horizontal side 1006 is defined as a lateral side of the exterior lead bottom body 1004.

The exterior lead bottom body 1004 can include a horizontally contiguous structure. The term "horizontally contiguous" means that the exterior lead bottom body 1004 is formed without a recess or any openings horizontally from the exterior bottom non-horizontal side 1006 to another of the exterior bottom non-horizontal side 1006 facing away from the exterior bottom non-horizontal side 1006. In other words, the exterior lead bottom body 1004 includes a bottom extent without any openings or discontinuities.

For illustration purposes, the exterior bottom non-horizontal side 1006 is shown as a planar surface, although it is understood that the exterior bottom non-horizontal side 1006 can include any other surfaces. For example, the exterior bottom non-horizontal side 1006 can include a curve surface including a concave surface.

Each of the exterior leads 1002 can include an exterior lead top body 1010 over the exterior lead bottom body 1004. The exterior lead bottom body 1004 and the exterior lead top body 1010 are formed with a single integral structure that is made from the same material in a contiguous shape. The exterior lead top body 1010 can include a horizontal width less than a horizontal width of the exterior lead bottom body 1004.

Horizontal widths of the exterior lead bottom body 1004 and the exterior lead top body 1010 are defined as horizontal lengths between non-horizontal extents of the exterior lead bottom body 1004 and the exterior lead top body 1010, respectively. For example, a horizontal width of the exterior lead top body 1010 can be approximately equal to half of a horizontal width of the exterior lead bottom body 1004.

Each of the exterior leads 1002 can include an exterior lead bottom conductive layer 1012, which is defined as an attachment site providing electrical connection to the exterior lead bottom body 1004. The exterior lead bottom conductive layer 1012 can be formed directly on a bottom extent of the exterior lead bottom body 1004.

Each of the exterior leads 1002 can include an exterior lead top conductive layer 1014, which is defined as an attachment site providing electrical connection to the exterior lead top body 1010. The exterior lead top conductive layer 1014 can include an exterior top protrusion 1016 having a protrusion interior portion 1018 and a protrusion exterior portion 1020.

The exterior lead top conductive layer 1014 can include an exterior top non-horizontal portion 1022 and an exterior top connection portion 1024 connected to the exterior top protrusion 1016 and the exterior top non-horizontal portion 1022. The exterior top connection portion 1024 can include a curve surface including a concave surface.

The exterior top protrusion 1016 horizontally extends from the exterior top connection portion 1024. The exterior top protrusion 1016 can completely horizontally surround the exterior top non-horizontal portion 1022.

The exterior lead top conductive layer 1014 can include an exterior top non-vertical portion 1026 having an exterior top non-vertical upper side 1028. The exterior top non-horizontal portion 1022 downwardly extends from the exterior top non-vertical portion 1026. The exterior top non-horizontal portion 1022 is connected to the exterior top connection portion 1024 and the exterior top non-vertical portion 1026. The exterior top non-vertical upper side 1028 is defined as a top extent of the exterior top non-vertical portion 1026.

The protrusion interior portion 1018, the protrusion exterior portion 1020, the exterior top non-horizontal portion 1022, the exterior top connection portion 1024, and the exterior top non-vertical portion 1026 can be formed with a single integral structure that is made from the same material in a contiguous shape. The protrusion interior portion 1018 and the protrusion exterior portion 1020 can be formed directly on a portion of a peripheral region of the exterior bottom body top side 1008.

The exterior top non-horizontal portion 1022 can be formed directly on a non-horizontal side of the exterior lead top body 1010. The exterior top connection portion 1024 can be formed directly on a portion of the exterior bottom body top side 1008 and a portion of a non-horizontal side of the exterior lead top body 1010. The exterior top non-vertical portion 1026 can be formed directly on a top extent of the exterior lead top body 1010.

The integrated circuit packaging system 1000 can include interior leads 1030, which are defined as conductive structures that provide connectivity for electrical signals or electrical potential levels between the integrated circuit packaging system 1000 and the external system. For example, the interior leads 1030 can represent terminals.

Each of the interior leads 1030 can include an interior lead body 1032 having an interior body non-horizontal side 1034. The interior body non-horizontal side 1034 is defined as a lateral side of the interior lead body 1032. A top extent of the interior lead body 1032 can be coplanar with the exterior bottom body top side 1008.

For illustration purposes, the interior body non-horizontal side 1034 is shown as a planar surface, although it is understood that the interior body non-horizontal side 1034 can include any other surfaces. For example, the interior body non-horizontal side 1034 can include a curve surface including a concave surface.

Each of the interior leads 1030 can include an interior lead bottom conductive layer 1038, which is defined as an attachment site providing electrical connection to the interior lead body 1032. The interior lead bottom conductive layer 1038 can be formed directly on a bottom extent of the interior lead body 1032.

Each of the interior leads 1030 can include an interior lead top conductive layer 1042, which is defined as an attachment site providing electrical connection to the interior lead body 1032. The interior lead top conductive layer 1042 can be formed directly on a portion of a top extent of the interior lead body 1032.

The integrated circuit packaging system 1000 can include a package paddle 1044, which is defined as a support structure for mounting or attaching a semiconductor device thereon. The package paddle 1044 can be adjacent the exterior leads 1002. The package paddle 1044 can be completely horizontally surrounded by the exterior leads 1002.

The package paddle 1044 can include a paddle body 1046 having a paddle non-horizontal side 1048, which is defined as a lateral side of the package paddle 1044. The paddle non-horizontal side 1048 extends from a bottom extent of the paddle body 1046 and a top extent of the paddle body 1046.

For illustration purposes, the paddle non-horizontal side 1048 is shown as a planar surface, although it is understood that the paddle non-horizontal side 1048 can include any other surfaces. For example, the paddle non-horizontal side 1048 can include a curve surface including a concave surface.

The package paddle 1044 can include a paddle conductive layer 1050, which is defined as an attachment site providing electrical connection to the paddle body 1046. The paddle conductive layer 1050 can be formed directly on a bottom extent of the paddle body 1046.

The integrated circuit packaging system 1000 can include an attach layer 1052, which is defined as a structure for mounting a semiconductor device to a support structure. The integrated circuit packaging system 1000 can include an integrated circuit 1054, which is defined as a semiconductor device having a number of integrated transistors interconnected to form active circuits.

The integrated circuit 1054 can be mounted over the package paddle 1044. The integrated circuit 1054 can include an inactive side 1056 and an active side 1058 opposite the inactive side 1056. The inactive side 1056 can be attached to the package paddle 1044 with the attach layer 1052.

The integrated circuit packaging system 1000 can include electrical connectors 1060, which are defined as electrically conductive connectors. One of the electrical connectors 1060 can be electrically connected or attached to the protrusion interior portion 1018 and the active side 1058. Another of the electrical connectors 1060 can be electrically connected or attached to the interior lead top conductive layer 1042 and the active side 1058.

The protrusion interior portion 1018 faces the integrated circuit 1054. The protrusion exterior portion 1020 faces away from the integrated circuit 1054. The protrusion interior portion 1018 can include a horizontal length greater than a horizontal length of the protrusion exterior portion 1020 to provide a surface area at a top extent of the protrusion interior portion 1018 for one of the electrical connectors 1060 to be attached thereto.

The interior leads 1030 can be formed in an array with a number of rows completely surrounding the integrated circuit 1054. The exterior leads 1002 can be formed in an array with a number of rows completely surrounding an array of the interior leads 1030. The interior leads 1030 can be formed between the exterior leads 1002 and the integrated circuit 1054.

The integrated circuit packaging system 1000 can include an encapsulation 1070, which is defined as a package cover of a semiconductor package to hermetically seal a semiconductor device providing mechanical and environmental protection. The encapsulation 1070 can cover the integrated circuit 1054. The encapsulation 1070 can be formed over or on the exterior lead top conductive layer 1014, a top extent of the interior lead body 1032, the interior lead top conductive layer 1042, a top extent of the package paddle 1044, the attach layer 1052, and the electrical connectors 1060.

The encapsulation 1070 can include an encapsulation bottom side 1072, which is defined as a lower extent of the encapsulation 1070. The encapsulation bottom side 1072 and bottom extents of the protrusion interior portion 1018, the protrusion exterior portion 1020, and the interior lead top conductive layer 1042 can be coplanar with each other.

The exterior lead bottom body 1004, the interior lead body 1032, and the package paddle 1044 can protrude from the encapsulation bottom side 1072. The exterior bottom non-horizontal side 1006, the exterior lead bottom conductive layer 1012, the interior body non-horizontal side 1034, the interior lead bottom conductive layer 1038, the paddle non-horizontal side 1048, and the paddle conductive layer 1050 can be below the encapsulation bottom side 1072.

The encapsulation 1070 can include an encapsulation top side 1076, which is defined as an upper extent of the encapsulation 1070. The encapsulation 1070 can expose the exterior top non-vertical upper side 1028.

The encapsulation top side 1076 can be coplanar with the exterior top non-vertical upper side 1028. Non-horizontal sides of the exterior lead bottom conductive layer 1012, the exterior lead bottom body 1004, the protrusion exterior portion 1020, and the encapsulation 1070 can be coplanar with each other.

It has been discovered that the encapsulation 1070 exposing the exterior top non-vertical upper side 1028 provides improved reliability since the exterior top non-vertical upper side 1028 is used for three-dimensional (3D) package integration for stacking known-good units.

It has also been discovered that the exterior lead bottom body 1004 also provides improved reliability since the exterior lead bottom body 1004 includes a horizontally contiguous structure thereby providing a robust structure.

It has further been discovered that the exterior leads 1002 each having the exterior top protrusion 1016 with the protrusion interior portion 1018 and the protrusion exterior portion 1020 provides improved signal integrity since the electrical connectors 1060 are able to make reliable connection to the protrusion interior portion 1018.

It has yet further been discovered that the exterior lead top conductive layer 1014 provides reduced height profile with the exterior lead top conductive layer 1014 having the exterior top protrusion 1016, the exterior top non-horizontal portion 1022, the exterior top connection portion 1024, and the exterior top non-vertical portion 1026 formed as a single vertical integral structure thereby reducing the overall height for stacking a semiconductor package thereon.

It has yet further been discovered that the protrusion interior portion 1018 having a horizontal length greater than a horizontal length of the protrusion exterior portion 1020 provides improved yield with more area for reliable attachment of the electrical connectors 1060.

It has yet further been discovered that the exterior lead bottom body 1004, the interior lead body 1032, and the paddle body 1046 protruding from the encapsulation bottom side 1072 provides improved reliability by eliminating electrical short problems between the exterior leads 1002 and the interior leads 1030 and between the interior leads 1030 and the package paddle 1044 with the exterior lead bottom conductive layer 1012, the interior lead bottom conductive layer 1038, and the paddle conductive layer 1050 below the encapsulation bottom side 1072.

It has yet further been discovered that the encapsulation bottom side 1072 and bottom extents of the protrusion interior portion 1018 and the protrusion exterior portion 1020 coplanar with each other provides improved reliability because the exterior top protrusion 1016 is covered by the encapsulation 1070 thereby eliminating peeling of the exterior top protrusion 1016 during board level reliability (BLR) and drop tests.

It has yet further been discovered that an array of a number of rows of the exterior leads 1002 and a number of rows of the interior leads 1030 provide improved reliability by providing additional attachment sites for mounting the exterior lead bottom conductive layer 1012 and the interior lead bottom conductive layer 1038 on a semiconductor package.

Figure 11:
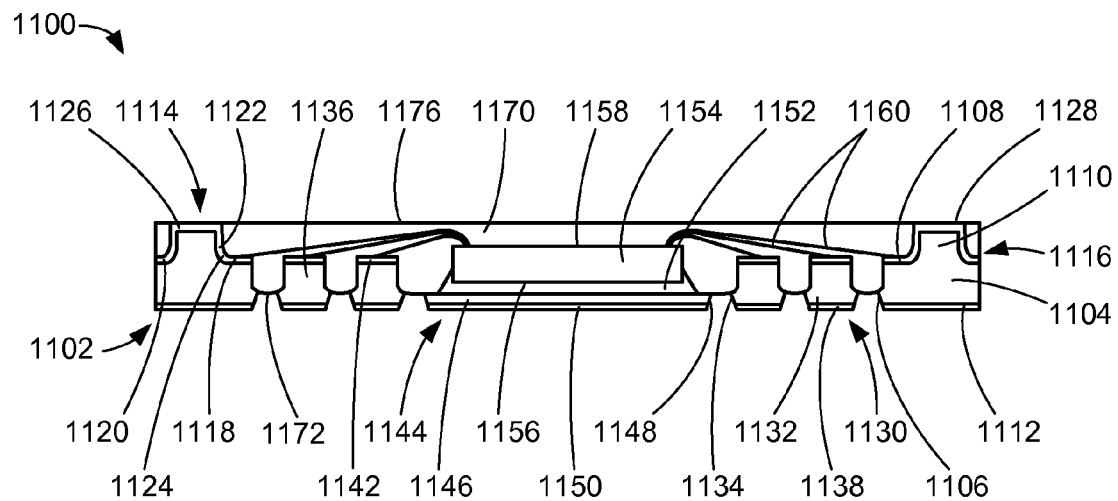
FIG. 11 is a cross-sectional view of an integrated circuit packaging system in a fifth embodiment of the present invention.

Referring now to FIG. 11, therein is shown a cross-sectional view of an integrated circuit packaging system 1100 in a fifth embodiment of the present invention. The integrated circuit packaging system 1100 can include multiple levels of carrier processing including two levels of leadframe etching.

The integrated circuit packaging system 1100 can include exterior leads 1102, which are defined as conductive structures that provide connectivity for electrical signals or electrical potential levels between the integrated circuit packaging system 1100 and an external system (not shown). For example, the exterior leads 1102 can represent terminals.

Each of the exterior leads 1102 can include an exterior lead bottom body 1104 having an exterior bottom non-horizontal side 1106 and an exterior bottom body top side 1108. The exterior bottom non-horizontal side 1106 is defined as a lateral side of the exterior lead bottom body 1104.

The exterior lead bottom body 1104 can include a horizontally contiguous structure. The term "horizontally contiguous" means that the exterior lead bottom body 1104 is formed without a recess or any openings horizontally from the exterior bottom non-horizontal side 1106 to another of the exterior bottom non-horizontal side 1106 facing away from the exterior bottom non-horizontal side 1106. In other words, the exterior lead bottom body 1104 includes a bottom extent without any openings or discontinuities.

For illustration purposes, the exterior bottom non-horizontal side 1106 is shown as a planar surface, although it is understood that the exterior bottom non-horizontal side 1106 can include any other surfaces. For example, the exterior bottom non-horizontal side 1106 can include a curve surface including a concave surface.

Each of the exterior leads 1102 can include an exterior lead top body 1110 over the exterior lead bottom body 1104. The exterior lead bottom body 1104 and the exterior lead top body 1110 are formed with a single integral structure that is made from the same material in a contiguous shape. The exterior lead top body 1110 can include a horizontal width less than a horizontal width of the exterior lead bottom body 1104.

Horizontal widths of the exterior lead bottom body 1104 and the exterior lead top body 1110 are defined as horizontal lengths between non-horizontal extents of the exterior lead bottom body 1104 and the exterior lead top body 1110, respectively. For example, a horizontal width of the exterior lead top body 1110 can be approximately equal to half of a horizontal width of the exterior lead bottom body 1104.

Each of the exterior leads 1102 can include an exterior lead bottom conductive layer 1112, which is defined as an attachment site providing electrical connection to the exterior lead bottom body 1104. The exterior lead bottom conductive layer 1112 can be formed directly on a bottom extent of the exterior lead bottom body 1104.

Each of the exterior leads 1102 can include an exterior lead top conductive layer 1114, which is defined as an attachment site providing electrical connection to the exterior lead top body 1110. The exterior lead top conductive layer 1114 can include an exterior top protrusion 1116 having a protrusion interior portion 1118 and a protrusion exterior portion 1120.

The exterior lead top conductive layer 1114 can include an exterior top non-horizontal portion 1122 and an exterior top connection portion 1124 connected to the exterior top protrusion 1116 and the exterior top non-horizontal portion 1122. The exterior top connection portion 1124 can include a curve surface including a concave surface.

The exterior top protrusion 1116 horizontally extends from the exterior top connection portion 1124. The exterior top protrusion 1116 can completely horizontally surround the exterior top non-horizontal portion 1122.

The exterior lead top conductive layer 1114 can include an exterior top non-vertical portion 1126 having an exterior top non-vertical upper side 1128. The exterior top non-horizontal portion 1122 downwardly extends from the exterior top non-vertical portion 1126. The exterior top non-horizontal portion 1122 is connected to the exterior top connection portion 1124 and the exterior top non-vertical portion 1126. The exterior top non-vertical upper side 1128 is defined as a top extent of the exterior top non-vertical portion 1126.

The protrusion interior portion 1118, the protrusion exterior portion 1120, the exterior top non-horizontal portion 1122, the exterior top connection portion 1124, and the exterior top non-vertical portion 1126 can be formed with a single integral structure that is made from the same material in a contiguous shape. The protrusion interior portion 1118 and the protrusion exterior portion 1120 can be formed directly on a portion of a peripheral region of the exterior bottom top side 1108.

The exterior top non-horizontal portion 1122 can be formed directly on a non-horizontal side of the exterior lead top body 1110. The exterior top connection portion 1124 can be formed directly on a portion of the exterior bottom top side 1108 and a portion of a non-horizontal side of the exterior lead top body 1110. The exterior top non-vertical portion 1126 can be formed directly on a top extent of the exterior lead top body 1110.

The integrated circuit packaging system 1100 can include interior leads 1130, which are defined as conductive structures that provide connectivity for electrical signals or electrical potential levels between the integrated circuit packaging system 1100 and the external system. For example, the interior leads 1130 can represent terminals.

Each of the interior leads 1130 can include an interior lead bottom body 1132 having an interior bottom non-horizontal side 1134. The interior bottom non-horizontal side 1134 is defined as a lateral side of the interior lead bottom body 1132.

Each of the interior leads 1130 can include an interior lead top body 1136 over the interior lead bottom body 1132. The interior lead bottom body 1132 and the interior lead top body 1136 are formed with a single integral structure that is made from the same material in a contiguous shape.

For illustration purposes, the interior bottom non-horizontal side 1134 is shown as a planar surface, although it is understood that the interior bottom non-horizontal side 1134 can include any other surfaces. For example, the interior bottom non-horizontal side 1134 can include a curve surface including a concave surface.

Each of the interior leads 1130 can include an interior lead bottom conductive layer 1138, which is defined as an attachment site providing electrical connection to the interior lead bottom body 1132. The interior lead bottom conductive layer 1138 can be formed directly on a bottom extent of the interior lead bottom body 1132.

Each of the interior leads 1130 can include an interior lead top conductive layer 1142, which is defined as an attachment site providing electrical connection to the interior lead bottom body 1132. The interior lead top conductive layer 1142 can be formed directly on a top extent of the interior lead top body 1136.

The integrated circuit packaging system 1100 can include a package paddle 1144, which is defined as a support structure for mounting or attaching a semiconductor device thereon. The package paddle 1144 can be adjacent the exterior leads 1102. The package paddle 1144 can be completely horizontally surrounded by the exterior leads 1102.

The package paddle 1144 can include a paddle body 1146 having a paddle non-horizontal side 1148, which is defined as a lateral side of the package paddle 1144. The paddle non-horizontal side 1148 extends from a bottom extent of the paddle body 1146 and a top extent of the paddle body 1146.

For illustration purposes, the paddle non-horizontal side 1148 is shown as a planar surface, although it is understood that the paddle non-horizontal side 1148 can include any other surfaces. For example, the paddle non-horizontal side 1148 can include a curve surface including a concave surface.

The package paddle 1144 can include a paddle conductive layer 1150, which is defined as an attachment site providing electrical connection to the paddle body 1146. The paddle conductive layer 1150 can be formed directly on a bottom extent of the paddle body 1146.

The integrated circuit packaging system 1100 can include an attach layer 1152, which is defined as a structure for mounting a semiconductor device to a support structure. The integrated circuit packaging system 1100 can include an integrated circuit 1154, which is defined as a semiconductor device having a number of integrated transistors interconnected to form active circuits.

The integrated circuit 1154 can be mounted over the package paddle 1144. The integrated circuit 1154 can include an inactive side 1156 and an active side 1158 opposite the inactive side 1156. The inactive side 1156 can be attached to the package paddle 1144 with the attach layer 1152.

The integrated circuit packaging system 1100 can include electrical connectors 1160, which are defined as electrically conductive connectors. One of the electrical connectors 1160 can be electrically connected or attached to the protrusion interior portion 1118 and the active side 1158. Another of the electrical connectors 1160 can be electrically connected or attached to the interior lead top conductive layer 1142 and the active side 1158.

The protrusion interior portion 1118 faces the integrated circuit 1154. The protrusion exterior portion 1120 faces away from the integrated circuit 1154. The protrusion interior portion 1118 can include a horizontal length greater than a horizontal length of the protrusion exterior portion 1120 to provide a surface area at a top extent of the protrusion interior portion 1118 for one of the electrical connectors 1160 to be attached thereto.

The interior leads 1130 can be formed in an array with a number of rows completely surrounding the integrated circuit 1154. The exterior leads 1102 can be formed in an array with a number of rows completely surrounding an array of the interior leads 1130. The interior leads 1130 can be formed between the exterior leads 1102 and the integrated circuit 1154.

The integrated circuit packaging system 1100 can include an encapsulation 1170, which is defined as a package cover of a semiconductor package to hermetically seal a semiconductor device providing mechanical and environmental protection. The encapsulation 1170 can cover the integrated circuit 1154. The encapsulation 1170 can be formed over or on the exterior lead top conductive layer 1114, a top extent of the interior lead top body 1136, the interior lead top conductive layer 1142, a top extent of the package paddle 1144, the attach layer 1152, and the electrical connectors 1160.

The encapsulation 1170 can include an encapsulation bottom side 1172, which is defined as a lower extent of the encapsulation 1170. Bottom extents of the protrusion interior portion 1118, the protrusion exterior portion 1120, and the interior lead top conductive layer 1142 can be coplanar to each other.

The exterior lead bottom body 1104, the interior lead bottom body 1132, and the package paddle 1144 can protrude from the encapsulation bottom side 1172. The exterior bottom non-horizontal side 1106, the exterior lead bottom conductive layer 1112, the interior bottom non-horizontal side 1134, the interior lead bottom conductive layer 1138, the paddle non-horizontal side 1148, and the paddle conductive layer 1150 can be below the encapsulation bottom side 1172.

For illustration purposes, the encapsulation bottom side 1172 is shown with a curve shape including convex, although it is understood that the encapsulation bottom side 1172 can include any shapes. For example, the encapsulation bottom side 1172 can include a straight surface.

The exterior lead bottom body 1104 and the interior lead bottom body 1132 can be below the encapsulation bottom side 1172. The exterior lead top body 1110 and the interior lead top body 1136 can be above the encapsulation bottom side 1172. The protrusion interior portion 1118, the protrusion exterior portion 1120, and the interior lead top conductive layer can be above the encapsulation bottom side 1172.

The encapsulation 1170 can include an encapsulation top side 1176, which is defined as an upper extent of the encapsulation 1170. The encapsulation 1170 can expose the exterior top non-vertical upper side 1128.

The encapsulation top side 1176 can be coplanar with the exterior top non-vertical upper side 1128. Non-horizontal sides of the exterior lead bottom conductive layer 1112, the exterior lead bottom body 1104, the protrusion exterior portion 1120, and the encapsulation 1170 can be coplanar with each other.

It has been discovered that the encapsulation 1170 exposing the exterior top non-vertical upper side 1128 provides improved reliability since the exterior top non-vertical upper side 1128 is used for three-dimensional (3D) package integration for stacking known-good units.

It has also been discovered that the exterior lead bottom body 1104 also provides improved reliability since the exterior lead bottom body 1104 includes a horizontally contiguous structure thereby providing a robust structure.

It has further been discovered that the exterior leads 1102 each having the exterior top protrusion 1116 with the protrusion interior portion 1118 and the protrusion exterior portion 1120 provides improved signal integrity since the electrical connectors 1160 are able to make reliable connection to the protrusion interior portion 1118.

It has yet further been discovered that the exterior lead top conductive layer 1114 provides reduced height profile with the exterior lead top conductive layer 1114 having the exterior top protrusion 1116, the exterior top non-horizontal portion 1122, the exterior top connection portion 1124, and the exterior top non-vertical portion 1126 formed as a single vertical integral structure thereby reducing the overall height for stacking a semiconductor package thereon.

It has yet further been discovered that the protrusion interior portion 1118 having a horizontal length greater than a horizontal length of the protrusion exterior portion 1120 provides improved yield with more area for reliable attachment of the electrical connectors 1160.

It has yet further been discovered that the exterior lead bottom body 1104, the interior lead bottom body 1132, and the paddle body 1146 protruding from the encapsulation bottom side 1172 provides improved reliability by eliminating electrical short problems between the exterior leads 1102 and the interior leads 1130 and between the interior leads 1130 and the package paddle 1144 with the exterior lead bottom conductive layer 1112, the interior lead bottom conductive layer 1138, and the paddle conductive layer 1150 below the encapsulation bottom side 1172.

It has yet further been discovered that the encapsulation bottom side 1172 and bottom extents of the protrusion interior portion 1118 and the protrusion exterior portion 1120 coplanar with each other provides improved reliability because the exterior top protrusion 1116 is covered by the encapsulation 1170 thereby eliminating peeling of the exterior top protrusion 1116 during board level reliability (BLR) and drop tests.

It has yet further been discovered that an array of a number of rows of the exterior leads 1102 and a number of rows of the interior leads 1130 provide improved reliability by providing additional attachment sites for mounting the exterior lead bottom conductive layer 1112 and the interior lead bottom conductive layer 1138 on a semiconductor package.

It has yet further been discovered that the protrusion interior portion 1118 and the interior lead top conductive layer 1142 above the encapsulation bottom side 1172 provides improved reliability due to reduced interconnection lengths of the electrical connectors 1160 thereby eliminating wire sweep during a molding process.

Figure 12:
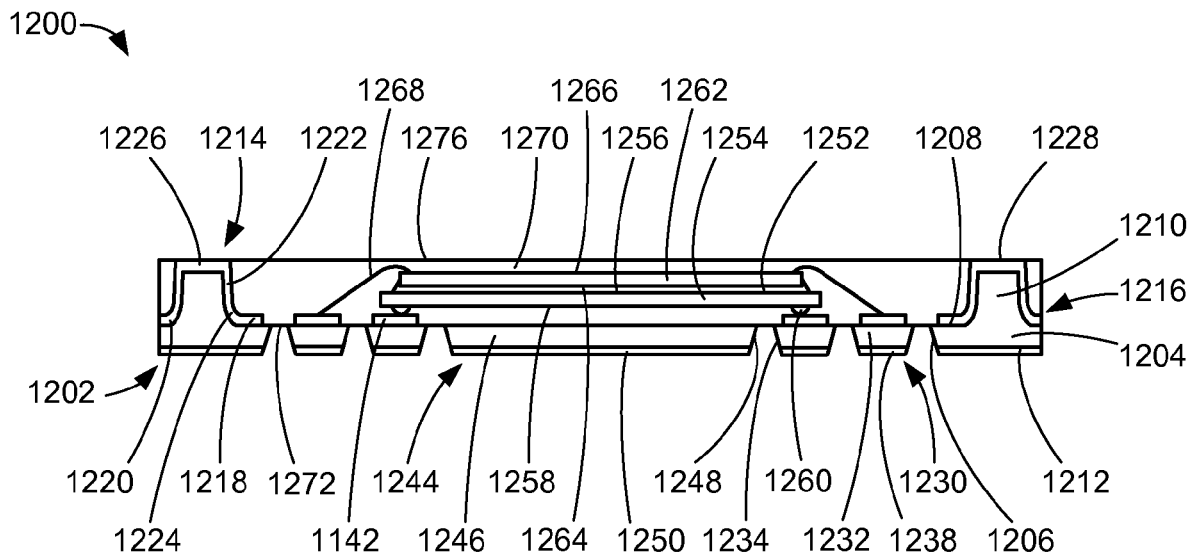
FIG. 12 is a cross-sectional view of an integrated circuit packaging system in a sixth embodiment of the present invention.

Referring now to FIG. 12, therein is shown a cross-sectional view of an integrated circuit packaging system 1200 in a sixth embodiment of the present invention. The integrated circuit packaging system 1200 can include a structure with an integrated flip chip.

The integrated circuit packaging system 1200 can include exterior leads 1202, which are defined as conductive structures that provide connectivity for electrical signals or electrical potential levels between the integrated circuit packaging system 1200 and an external system (not shown). For example, the exterior leads 1202 can represent terminals.

Each of the exterior leads 1202 can include an exterior lead bottom body 1204 having an exterior bottom non-horizontal side 1206 and an exterior bottom body top side 1208. The exterior bottom non-horizontal side 1206 is defined as a lateral side of the exterior lead bottom body 1204.

The exterior lead bottom body 1204 can include a horizontally contiguous structure. The term "horizontally contiguous" means that the exterior lead bottom body 1204 is formed without a recess or any openings horizontally from the exterior bottom non-horizontal side 1206 to another of the exterior bottom non-horizontal side 1206 facing away from the exterior bottom non-horizontal side 1206. In other words, the exterior lead bottom body 1204 includes a bottom extent without any openings or discontinuities.

For illustration purposes, the exterior bottom non-horizontal side 1206 is shown as a planar surface, although it is understood that the exterior bottom non-horizontal side 1206 can include any other surfaces. For example, the exterior bottom non-horizontal side 1206 can include a curve surface including a concave surface.

Each of the exterior leads 1202 can include an exterior lead top body 1210 over the exterior lead bottom body 1204. The exterior lead bottom body 1204 and the exterior lead top body 1210 are formed with a single integral structure that is made from the same material in a contiguous shape. The exterior lead top body 1210 can include a horizontal width less than a horizontal width of the exterior lead bottom body 1204.

Horizontal widths of the exterior lead bottom body 1204 and the exterior lead top body 1210 are defined as horizontal lengths between non-horizontal extents of the exterior lead bottom body 1204 and the exterior lead top body 1210, respectively. For example, a horizontal width of the exterior lead top body 1210 can be approximately equal to half of a horizontal width of the exterior lead bottom body 1204.

Each of the exterior leads 1202 can include an exterior lead bottom conductive layer 1212, which is defined as an attachment site providing electrical connection to the exterior lead bottom body 1204. The exterior lead bottom conductive layer 1212 can be formed directly on a bottom extent of the exterior lead bottom body 1204.

Each of the exterior leads 1202 can include an exterior lead top conductive layer 1214, which is defined as an attachment site providing electrical connection to the exterior lead top body 1210. The exterior lead top conductive layer 1214 can include an exterior top protrusion 1216 having a protrusion interior portion 1218 and a protrusion exterior portion 1220.

The exterior lead top conductive layer 1214 can include an exterior top non-horizontal portion 1222 and an exterior top connection portion 1224 connected to the exterior top protrusion 1216 and the exterior top non-horizontal portion 1222. The exterior top connection portion 1224 can include a curve surface including a concave surface.

The exterior top protrusion 1216 horizontally extends from the exterior top connection portion 1224. The exterior top protrusion 1216 can completely horizontally surround the exterior top non-horizontal portion 1222.

The exterior lead top conductive layer 1214 can include an exterior top non-vertical portion 1226 having an exterior top non-vertical upper side 1228. The exterior top non-horizontal portion 1222 downwardly extends from the exterior top non-vertical portion 1226. The exterior top non-horizontal portion 1222 is connected to the exterior top connection portion 1224 and the exterior top non-vertical portion 1226. The exterior top non-vertical upper side 1228 is defined as a top extent of the exterior top non-vertical portion 1226.

The protrusion interior portion 1218, the protrusion exterior portion 1220, the exterior top non-horizontal portion 1222, the exterior top connection portion 1224, and the exterior top non-vertical portion 1226 can be formed with a single integral structure that is made from the same material in a contiguous shape. The protrusion interior portion 1218 and the protrusion exterior portion 1220 can be formed directly on a portion of a peripheral region of the exterior bottom body top side 1208.

The exterior top non-horizontal portion 1222 can be formed directly on a non-horizontal side of the exterior lead top body 1210. The exterior top connection portion 1224 can be formed directly on a portion of the exterior bottom body top side 1208 and a portion of a non-horizontal side of the exterior lead top body 1210. The exterior top non-vertical portion 1226 can be formed directly on a top extent of the exterior lead top body 1210.

The integrated circuit packaging system 1200 can include interior leads 1230, which are defined as conductive structures that provide connectivity for electrical signals or electrical potential levels between the integrated circuit packaging system 1200 and the external system. For example, the interior leads 1230 can represent terminals.

Each of the interior leads 1230 can include an interior lead body 1232 having an interior body non-horizontal side 1234. The interior body non-horizontal side 1234 is defined as a lateral side of the interior lead body 1232. A top extent of the interior lead body 1232 can be coplanar with the exterior bottom body top side 1208.

For illustration purposes, the interior body non-horizontal side 1234 is shown as a planar surface, although it is understood that the interior body non-horizontal side 1234 can include any other surfaces. For example, the interior body non-horizontal side 1234 can include a curve surface including a concave surface.

Each of the interior leads 1230 can include an interior lead bottom conductive layer 1238, which is defined as an attachment site providing electrical connection to the interior lead body 1232. The interior lead bottom conductive layer 1238 can be formed directly on a bottom extent of the interior lead body 1232.

Each of the interior leads 1230 can include an interior lead top conductive layer 1242, which is defined as an attachment site providing electrical connection to the interior lead body 1232. The interior lead top conductive layer 1242 can be formed directly on a portion of a top extent of the interior lead body 1232.

The integrated circuit packaging system 1200 can include a package paddle 1244, which is defined as a support structure for mounting or attaching a semiconductor device thereon. The package paddle 1244 can be adjacent the exterior leads 1202. The package paddle 1244 can be completely horizontally surrounded by the exterior leads 1202.

The package paddle 1244 can include a paddle body 1246 having a paddle non-horizontal side 1248, which is defined as a lateral side of the package paddle 1244. The paddle non-horizontal side 1248 extends from a bottom extent of the paddle body 1246 and a top extent of the paddle body 1246.

For illustration purposes, the paddle non-horizontal side 1248 is shown as a planar surface, although it is understood that the paddle non-horizontal side 1248 can include any other surfaces. For example, the paddle non-horizontal side 1248 can include a curve surface including a concave surface.

The package paddle 1244 can include a paddle conductive layer 1250, which is defined as an attachment site providing electrical connection to the paddle body 1246. The paddle conductive layer 1250 can be formed directly on a bottom extent of the paddle body 1246.

The integrated circuit packaging system 1200 can include an attach layer 1252 and a base integrated circuit 1254 having a base inactive side 1256 and a base active side 1258. For example, the base integrated circuit 1254 can represent a flip chip.

The integrated circuit packaging system 1200 can include base electrical connectors 1260 and a stack integrated circuit 1262 having a stack inactive side 1264 and a stack active side 1266. The integrated circuit packaging system 1200 can include stack electrical connectors 1268.

The attach layer 1252 is defined as a structure for mounting a semiconductor device to a support structure or another semiconductor device. The base integrated circuit 1254 and the stack integrated circuit 1262 are defined as semiconductor devices having a number of integrated transistors interconnected to form active circuits. The base electrical connectors 1260 and the stack electrical connectors 1268 are defined as electrically conductive connectors.

The base integrated circuit 1254 can be mounted over the interior leads 1230 and the package paddle 1244. One of the base electrical connectors 1260 can be electrically connected or attached to the base active side 1258 and the interior lead top conductive layer 1242. The base active side 1258 can be facing the interior lead top conductive layer 1242.

The stack integrated circuit 1262 can be mounted over the base integrated circuit 1254. The attach layer 1252 can be attached to the base inactive side 1256 and the stack inactive side 1264.

One of the stack electrical connectors 1268 can be electrically connected or attached to another of the interior lead top conductive layer 1242 and the stack active side 1266. Another of the stack electrical connectors 1268 can be electrically connected or attached to the protrusion interior portion 1218 and the stack active side 1266.

The protrusion interior portion 1218 faces the interior leads 1230, the base integrated circuit 1254, and the stack integrated circuit 1262. The protrusion exterior portion 1220 faces away from the interior leads 1230, the base integrated circuit 1254, and the stack integrated circuit 1262. The protrusion interior portion 1218 can include a horizontal length greater than a horizontal length of the protrusion exterior portion 1220 to provide a surface area at a top extent of the protrusion interior portion 1218 for one of the stack electrical connectors 1268 to be attached thereto.

The interior leads 1230 can be formed in an array with a number of rows completely surrounding the base integrated circuit 1254 and the stack integrated circuit 1262. The exterior leads 1202 can be formed in an array with a number of rows completely surrounding an array of the interior leads 1230. The interior leads 1230 can be formed between the exterior leads 1202 and the base integrated circuit 1254.

The integrated circuit packaging system 1200 can include an encapsulation 1270, which is defined as a package cover of a semiconductor package to hermetically seal a semiconductor device providing mechanical and environmental protection. The encapsulation 1270 can cover the base integrated circuit 1254 and the stack integrated circuit 1262. The encapsulation 1270 can be formed over or on the exterior lead top conductive layer 1214, a top extent of the interior lead body 1232, the interior lead top conductive layer 1242, a top extent of the package paddle 1244, the attach layer 1252, the base electrical connectors 1260, and the stack electrical connectors 1268.

The encapsulation 1270 can include an encapsulation bottom side 1272, which is defined as a lower extent of the encapsulation 1270. The encapsulation bottom side 1272 and bottom extents of the protrusion interior portion 1218, the protrusion exterior portion 1220, and the interior lead top conductive layer 1242 can be coplanar with each other.

The exterior lead bottom body 1204, the interior lead body 1232, and the package paddle 1244 can protrude from the encapsulation bottom side 1272. The exterior bottom non-horizontal side 1206, the exterior lead bottom conductive layer 1212, the interior body non-horizontal side 1234, the interior lead bottom conductive layer 1238, the paddle non-horizontal side 1248, and the paddle conductive layer 1250 can be below the encapsulation bottom side 1272.

The encapsulation 1270 can include an encapsulation top side 1276, which is defined as an upper extent of the encapsulation 1270. The encapsulation 1270 can expose the exterior top non-vertical upper side 1228.

The encapsulation top side 1276 can be coplanar with the exterior top non-vertical upper side 1228. Non-horizontal sides of the exterior lead bottom conductive layer 1212, the exterior lead bottom body 1204, the protrusion exterior portion 1220, and the encapsulation 1270 can be coplanar with each other.

It has been discovered that the encapsulation 1270 exposing the exterior top non-vertical upper side 1228 provides improved reliability since the exterior top non-vertical upper side 1228 is used for three-dimensional (3D) package integration for stacking known-good units.

It has also been discovered that the exterior lead bottom body 1204 also provides improved reliability since the exterior lead bottom body 1204 includes a horizontally contiguous structure thereby providing a robust structure.

It has further been discovered that the exterior leads 1202 each having the exterior top protrusion 1216 with the protrusion interior portion 1218 and the protrusion exterior portion 1220 provides improved signal integrity since the base electrical connectors 1260 are able to make reliable connection to the protrusion interior portion 1218.

It has yet further been discovered that the exterior lead top conductive layer 1214 provides reduced height profile with the exterior lead top conductive layer 1214 having the exterior top protrusion 1216, the exterior top non-horizontal portion 1222, the exterior top connection portion 1224, and the exterior top non-vertical portion 1226 formed as a single vertical integral structure thereby reducing the overall height for stacking a semiconductor package thereon.

It has yet further been discovered that the protrusion interior portion 1218 having a horizontal length greater than a horizontal length of the protrusion exterior portion 1220 provides improved yield with more area for reliable attachment of the base electrical connectors 1260.

It has yet further been discovered that the exterior lead bottom body 1204, the interior lead body 1232, and the paddle body 1246 protruding from the encapsulation bottom side 1272 provides improved reliability by eliminating electrical short problems between the exterior leads 1202 and the interior leads 1230 and between the interior leads 1230 and the package paddle 1244 with the exterior lead bottom conductive layer 1212, the interior lead bottom conductive layer 1238, and the paddle conductive layer 1250 below the encapsulation bottom side 1272.

It has yet further been discovered that the encapsulation bottom side 1272 and bottom extents of the protrusion interior portion 1218 and the protrusion exterior portion 1220 coplanar with each other provides improved reliability because the exterior top protrusion 1216 is covered by the encapsulation 1270 thereby eliminating peeling of the exterior top protrusion 1216 during board level reliability (BLR) and drop tests.

It has yet further been discovered that an array of a number of rows of the exterior leads 1202 and a number of rows of the interior leads 1230 provide improved reliability by providing additional attachment sites for mounting the exterior lead bottom conductive layer 1212 and the interior lead bottom conductive layer 1238 on a semiconductor package.

Figure 13:
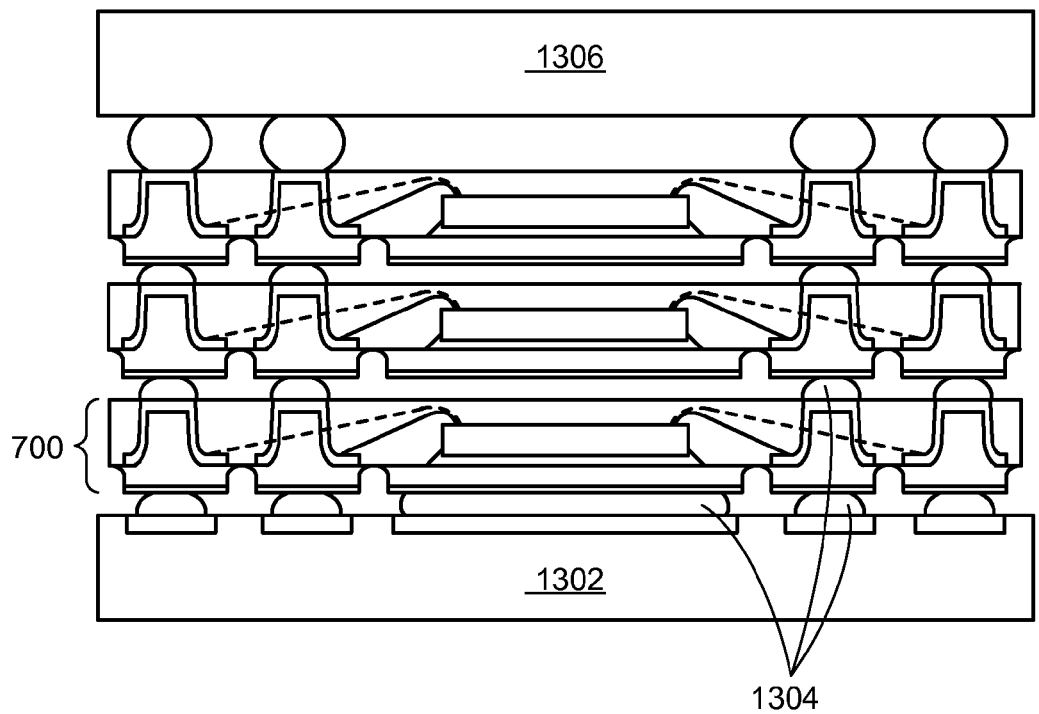
FIG. 13 is a cross-sectional view of a first application example.

Referring now to FIG. 13, therein is shown a cross-sectional view of a first application example. The cross-sectional view depicts a multiple stacking structure.

The first application example can include a support structure 1302 including a printed circuit board (PCB) and a first instance of the integrated circuit packaging system 700 mounted thereover. The integrated circuit packaging system 700 can be electrically attached to the support structure 1302 with electrical interconnects 1304, which are defined as electrically conductive connectors. For example, the electrical interconnects 1304 can represent an electrical connector including solder paste.

The first application example can include a stack of a number of the integrated circuit packaging system 700. A second instance of the integrated circuit packaging system 700 can be mounted over the first instance. A third instance of the integrated circuit packaging system 700 can be mounted over the second instance. For example, the stack can include semiconductor devices including memory and static random-access memory (SRAM).

The first application example can include a controller 1306 mounted over and electrically connected to the stack with a number of the electrical interconnects 1304. The controller 1306 is defined as a semiconductor device that interfaces with a peripheral device. For example, the controller 1306 can represent a chip or a memory controller. For example, the controller 1306 can represent a memory controller that manages access to memory for a computer.

Figure 14:
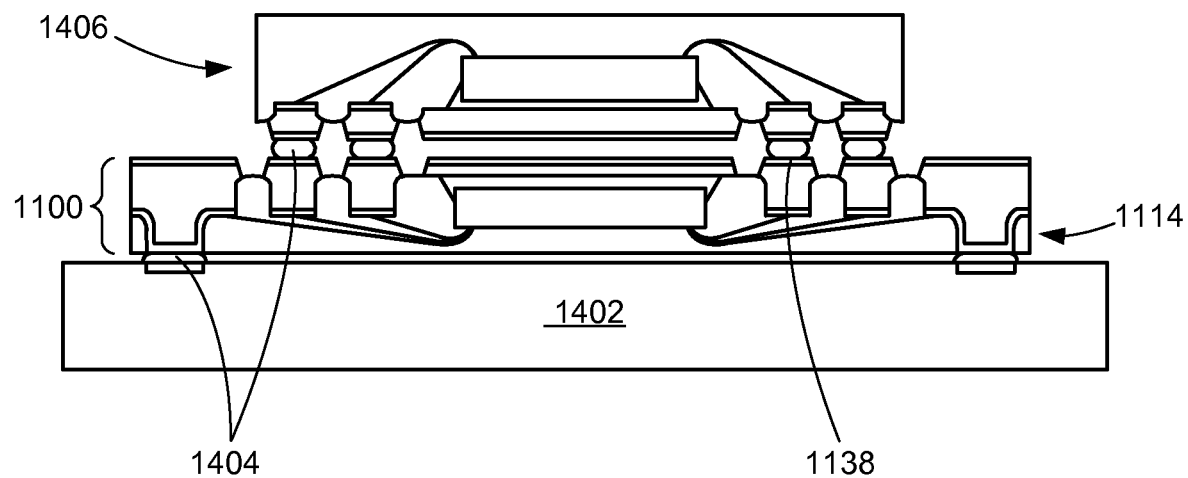
FIG. 14 is a cross-sectional view of a second application example.

Referring now to FIG. 14, therein is shown a cross-sectional view of a second application example. The cross-sectional view depicts a package-on-package structure.

The second application example can include a support structure 1402 including a printed circuit board (PCB) and the integrated circuit packaging system 1100 mounted thereover. The integrated circuit packaging system 1100 can be vertically inverted with the exterior lead top conductive layer 1114 facing the support structure 1402.

The integrated circuit packaging system 1100 can be electrically attached to the support structure 1402 with electrical interconnects 1404, which are defined as electrically conductive connectors. For example, the electrical interconnects 1404 can represent an electrical connector including solder paste.

The second application example can include a stack external package 1406, which is a semiconductor package, mounted over and electrically connected to the integrated circuit packaging system 1100. The stack external package 1406 can be attached to a plurality of the interior lead bottom conductive layer 1138 with a number of the electrical interconnects 1404.

Figure 15:
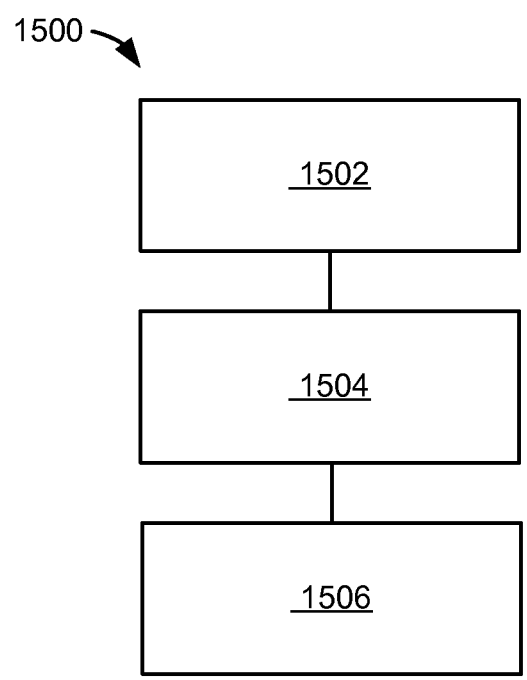
FIG. 15 is a flow chart of a method of manufacture of the integrated circuit packaging system in a further embodiment of the present invention.

Referring now to FIG. 15, therein is shown a flow chart of a method 1500 of manufacture of the integrated circuit packaging system 100 in a further embodiment of the present invention. The method 1500 includes: forming a lead having a lead bottom body, a lead top body, and a lead top conductive layer directly on the lead top body, the lead top conductive layer having a top protrusion and a top non-vertical portion, the lead bottom body having a horizontally contiguous structure in a block 1502; connecting an integrated circuit to the top protrusion in a block 1504; and forming an encapsulation covering the integrated circuit and exposing a top non-vertical upper side of the top non-vertical portion in a block 1506.

The present invention addresses a number of commercial problems. One of the commercial problems includes a need for a three-dimensional (3D) package integration solution using a low cost leaded platform. Other of the commercial problems include a need to use known-good unit for device stacking, multiple same-device stacking, and a stack package having a structure that allows stacking of multi-rows of leads. The present invention solves the problems by providing a unique structure of an outer lead that is exposed at the top of package, enabling same-device stacking.

The present invention provides cost efficiency of multi-row strip etched packages by providing a number of capabilities and features. One of the capabilities and features includes a strip etch-able, selective pre-plated leadframe (PPF) plated leadframe provides flexibility in a multi-row lead layout design, resulting in cost efficiency by providing more leads into a smaller package size or customizing lead layouts such that wires are kept to a minimum length.

Further regarding the capabilities and features, unlike conventional dual row quad flat no-lead (QFN) with protruding lead fingers, the present invention provides the strip etch-able, selective pre-plated leadframe (PPF) plated leadframe having a robust lead construction or process that is not prone to lead shifting. This feature makes the product design more cost efficient. The present invention makes possible same-device stacking of multi-row quad flat no-lead (QFN) packages with a simple process flow and flexible lead layout design by providing a strip-etch method of forming leads.

Thus, it has been discovered that the integrated circuit packaging system of the present invention furnishes important and heretofore unknown and unavailable solutions, capabilities, and functional aspects for an integrated circuit packaging system with pads. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a lead having:
        a lead bottom body, the lead bottom body having a horizontally contiguous structure,
        a lead top body, and
        a lead top conductive layer directly on the lead top body, the lead top conductive layer having a top protrusion, a top non-vertical portion, a top non-horizontal portion, and a top connection portion, the top connection portion connected to the top protrusion and the top non-horizontal portion, the top connection portion having a curve surface;
    connecting an integrated circuit to the top protrusion; and
    forming an encapsulation covering the integrated circuit and exposing a top non-vertical upper side of the top non-vertical portion.

2. The method as claimed in claim 1 wherein forming the lead includes forming the lead having the top protrusion with a protrusion interior portion and a protrusion exterior portion directly on the lead bottom body, the protrusion interior portion having a horizontal length greater than a horizontal length of the protrusion exterior portion.

3. The method as claimed in claim 1 wherein forming the lead includes forming the lead having a single integral structure with the top protrusion, the top non-horizontal portion, the top connection portion, and the top non-vertical portion.

4. The method as claimed in claim 1 wherein forming the encapsulation includes forming the encapsulation having an encapsulation bottom side with the lead bottom body protruding from the encapsulation bottom side.

5. The method as claimed in claim 1 wherein forming the encapsulation includes forming the encapsulation having a first encapsulation bottom side and a second encapsulation bottom side below thereof, the second encapsulation bottom side coplanar with a bottom extent of the lead bottom body.

6. A method of manufacture of an integrated circuit packaging system comprising:
forming a lead having:
a lead bottom body, the lead bottom body having a horizontally contiguous structure,
a lead top body, and
a lead top conductive layer directly on the lead top body, the lead top conductive layer having a top protrusion, a top non-vertical portion, a top non-horizontal portion, and a top connection portion, the top connection portion connected to the top protrusion and the top non-horizontal portion, the top connection portion having a curve surface;
connecting an integrated circuit to the top protrusion; and
forming an encapsulation covering the integrated circuit and exposing a top non-vertical upper side of the top non-vertical portion, the encapsulation coplanar with the top non-vertical upper side.

7. The method as claimed in claim 6 further comprising forming an interior lead having an interior lead top conductive layer coplanar with the top protrusion.

8. The method as claimed in claim 6 wherein forming the encapsulation includes forming the encapsulation having an encapsulation bottom side below the top protrusion.

9. The method as claimed in claim 6 wherein:
forming the lead includes forming leads; and
forming the encapsulation includes forming the encapsulation exposing the top non-vertical upper side of each of the leads.

10. The method as claimed in claim 6 further comprising mounting a stack integrated circuit over the integrated circuit.

11. An integrated circuit packaging system comprising:
a lead having:
a lead bottom body, the lead bottom body having a horizontally contiguous structure,
a lead top body, and
a lead top conductive layer directly on the lead top body, the lead top conductive layer having a top protrusion, a top non-vertical portion, a top non-horizontal portion, and a top connection portion, the top connection portion connected to the top protrusion and the top non-horizontal portion, the top connection portion having a curve surface;
integrated circuit connected to the top protrusion; and
an encapsulation covering the integrated circuit and exposing a top non-vertical upper side of the top non-vertical portion.

12. The system as claimed in claim 11 wherein the lead includes the top protrusion with a protrusion interior portion and a protrusion exterior portion directly on the lead bottom body, the protrusion interior portion having a horizontal length greater than a horizontal length of the protrusion exterior portion.

13. The system as claimed in claim 11 wherein the lead includes a single integral structure with the top protrusion, the top non-horizontal portion, the top connection portion, and the top non-vertical portion.

14. The system as claimed in claim 11 wherein the encapsulation includes an encapsulation bottom side with the lead bottom body protruding from the encapsulation bottom side.

15. The system as claimed in claim 11 wherein the encapsulation includes a first encapsulation bottom side and a second encapsulation bottom side below thereof, the second encapsulation bottom side coplanar with a bottom extent of the lead bottom body.

16. The system as claimed in claim 11 wherein the encapsulation is coplanar with the top non-vertical upper side.

17. The system as claimed in claim 16 further comprising an interior lead having an interior lead top conductive layer coplanar with the top protrusion.

18. The system as claimed in claim 16 wherein the encapsulation includes an encapsulation bottom side below the top protrusion.

19. The system as claimed in claim 16 wherein:
the lead includes leads; and
the encapsulation exposes the top non-vertical upper side of each of the leads.

20. The system as claimed in claim 16 further comprising a stack integrated circuit over the integrated circuit.

* * * * *